(12) United States Patent
Marks et al.

(10) Patent No.: US 8,907,337 B2
(45) Date of Patent: *Dec. 9, 2014

(54) INORGANIC-ORGANIC HYBRID THIN-FILM TRANSISTORS USING INORGANIC SEMICONDUCTING FILMS

(71) Applicant: Northwestern University, Evanston, IL (US)

(72) Inventors: Tobin J. Marks, Evanston, IL (US); Antonio Facchetti, Chicago, IL (US); Lian Wang, Evanston, IL (US); Myung-Han Yoon, Evanston, IL (US); Yu Yang, Santa Clara, CA (US)

(73) Assignee: Northwestern University, Evanston, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/791,599

(22) Filed: Mar. 8, 2013

(65) Prior Publication Data
US 2013/0193421 A1 Aug. 1, 2013

Related U.S. Application Data

(63) Continuation of application No. 13/351,050, filed on Jan. 16, 2012, now Pat. No. 8,395,150, which is a continuation of application No. 11/642,217, filed on Dec. 20, 2006, now Pat. No. 8,097,877.

(60) Provisional application No. 60/752,159, filed on Dec. 20, 2005.

(51) Int. Cl.
*H01L 29/10* (2006.01)
*B82Y 30/00* (2011.01)
*H01L 51/05* (2006.01)
*H01L 29/786* (2006.01)
*B82Y 10/00* (2011.01)

(52) U.S. Cl.
CPC ............ *H01L 51/0562* (2013.01); *B82Y 30/00* (2013.01); *H01L 29/78681* (2013.01); *H01L 29/7869* (2013.01); *B82Y 10/00* (2013.01)
USPC ....... 257/43; 257/E21.464; 438/101; 438/109

(58) Field of Classification Search
CPC .......... H01L 23/00; H01L 29/00; H01L 51/00
USPC ............. 257/43, E21.464, E23.119, E29.151; 438/101, 109, 778
See application file for complete search history.

(56) References Cited

U.S. PATENT DOCUMENTS

| | | | |
|---|---|---|---|
| 5,313,076 A | 5/1994 | Yamazaki et al. | |
| 5,828,080 A | 10/1998 | Yano et al. | |
| 6,596,569 B1 * | 7/2003 | Bao et al. | 438/151 |
| 7,679,079 B1 | 3/2010 | Marks | |

(Continued)

OTHER PUBLICATIONS

Gaskins, K.J.; Organic Self-Assembled Thin Films for Second Order Nonlinear Optics; Jul. 29, 2004.

(Continued)

*Primary Examiner* — Telly Green
(74) *Attorney, Agent, or Firm* — Reinhart Boerner Van Deuren s.c.

(57) ABSTRACT

Inorganic semiconducting compounds, composites and compositions thereof, and related device structures.

20 Claims, 23 Drawing Sheets

(56) References Cited

U.S. PATENT DOCUMENTS

| | | |
|---|---|---|
| 8,097,877 B2 | 1/2012 | Marks et al. |
| 2004/0222412 A1 | 11/2004 | Bai et al. |
| 2004/0251504 A1 | 12/2004 | Noda |
| 2005/0260803 A1 | 11/2005 | Halik et al. |
| 2006/0202195 A1 | 9/2006 | Marks et al. |
| 2006/0284171 A1 | 12/2006 | Levy et al. |
| 2006/0292777 A1 | 12/2006 | Dunbar |
| 2007/0178710 A1 | 8/2007 | Muyres et al. |
| 2007/0287221 A1 | 12/2007 | Ong et al. |

OTHER PUBLICATIONS

Menard, E.; Nuzzuo, R.G.; and Rogers; J.A.; Bendable Single Crystal Silicon Thin Film Transistors Formed by Printing on Plastic Substrates; Appl. Phys. Lett., 2005, 1-3, 093507, vol. 86.

Katz, H.E.; Organic Molecular Solids as Thin Film Transistor Semiconductors; J. Mater. Chem., 1997, 369-376, vol. 7, No. 3.

Carcia, P.F.; McClean, R.S.; and Reilly, M.N.; Oxide Engineering of ZnO Thin-film Transistors for Flexible Electronics; Journal of the Society for Information Display, Jul. 2005, 547-554, vol. 13, No. 7.

Jang, Y; Kim, DH; Park, YD; Cho, JH; Hwang, M; ND Cho, K; Influence of the Dielectric Constant of a Polyvinyl Phenol Insulator on the Field-effect Mobility of a Pentacene-based Thin-film Transistor, Appl. Phys. Lett, Oct. 2005, 152105, vol. 87.

Hoffman, RL; Norris, BJ; Wager, JF. "ZnO-based transparent thin-film transistors." Applied Physics Letters, vol. 82, No. 5, Feb. 3, 2003, pp. 733-735.

Nomura, K; Ohta, H; Takagi, A; Kamiya, T; Hirano, M; Hosono, H. "Room-temperature fabrication of transparent flexible thin-film transistors using amorphous oxide semiconductors." Nature, vol. 432, Nov. 25, 2004, pp. 488-492.

\* cited by examiner

Figure 1(E)
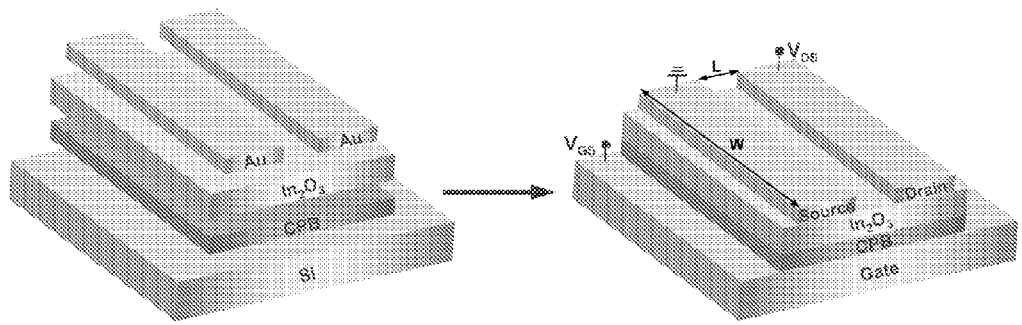
Figure 1(F)
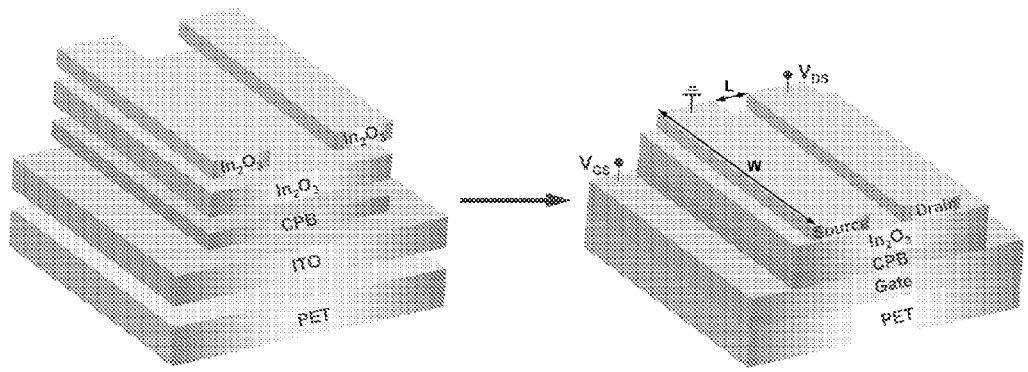
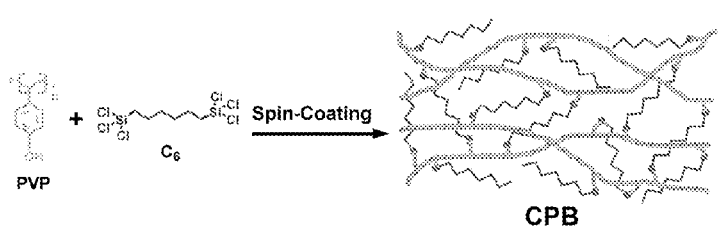
Figure 1(G)

Figure 12A
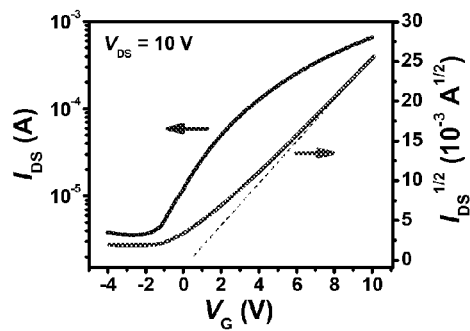
Figure 12B
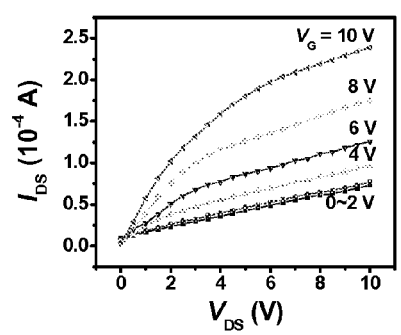
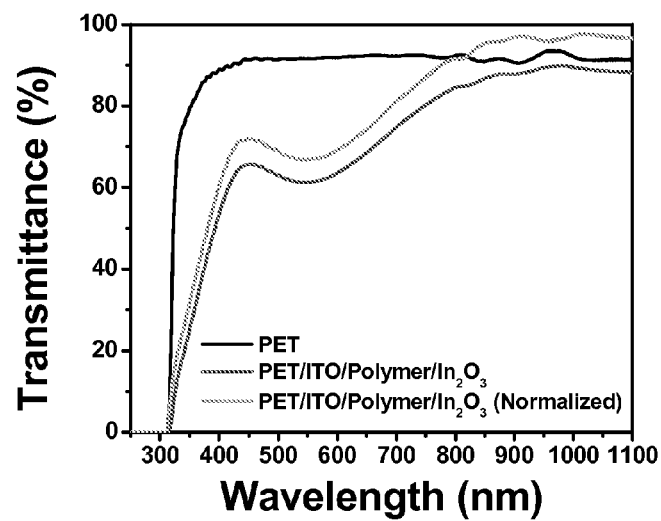
Figure 12C

INORGANIC-ORGANIC HYBRID THIN-FILM TRANSISTORS USING INORGANIC SEMICONDUCTING FILMS

This invention was made with government support under Grant No. CHE-0201767 awarded by the National Science Foundation, Grant No. DMR-0076097 awarded by the National Science Foundation, Grant No. NCC-2-1363 awarded by the National Aeronautics and Space Administration (NASA), and Grant No. W911NF-05-1-0187 awarded by the Army Research Office (DARPA). The government has certain rights in the invention.

BACKGROUND OF THE INVENTION

Thin-film transistors (TFTs) pervade our daily lives as indispensable elements in a myriad of electronic/photonic products, such as computers, cell phones, displays, household appliances and sensors. Furthermore, the future demand for next-generation mobile computing, communication and identification devices is expected to increase markedly. For diverse multiple functionalities, the electronics of ideal mobile devices must achieve light weight, low power consumption, low operating voltages (powered by household batteries) and compatibility with diverse substrates. Additional desirable features include optical transparency ('invisible electronics'), mechanical ruggedness, environmental stability and inexpensive room-temperature/large-area fabrication.

TFTs meeting all the aforementioned requirements have proved elusive and will doubtless require a new direction in choice of materials and processing strategies. Conventional inorganic TFTs based on silicon and related semiconductors exhibit desireable features, such as high carrier mobilities, but are also limited by marginal mechanical flexibility and/or mandatory high-temperature processing (frequently>400° C. for II/VI and III/V compound semiconductors and >250° C. for Si TFTs). While amorphous silicon TFTs have been fabricated on flexible plastic substrates at temperatures as low as 75-150° C., reported carrier mobilities are modest (~0.03-1 $cm^2 V^{-1} s^{-1}$ on inorganic insulators) and the material is optically opaque. Organic semiconductor materials provide low temperature processability and are compatible with substrate flexibility, but have typically provided low field-effect mobilities. Likewise, various concerns persist relating to choice of dielectric material and corresponding fabrication technique, such concerns as can relate to choice and incorporation of any one particular semiconductor material. Such complexities and competing issues illustrate an on-going concern in the art. The search continues for a comprehensive approach to TFT fabrication, one available at low process temperatures and/or compatible with flexible plastic substrates.

BRIEF DESCRIPTION OF THE DRAWINGS

FIGS. 1E-G. Inorganic-only and inorganic-organic hybrid TFTs fabricated using $In_2O_3$ thin films as the n-channel semiconductor and CPB dielectric as the gate insulator: E) TFTs on doped Si gate substrates with Au drain/source electrodes; F) flexible TFTs on PET/ITO substrates with high-conductivity $In_2O_3$ drain/source electrodes. G) Molecular structure of a representative crosslinked polymer blend (CPB) dielectric.

FIGS. 12A-C. Typical field-effect characteristics of fully transparent and flexible inorganic-organic hybrid TFTs using 60 nm thin-film $In_2O_3$ as the channel layer and a 165 nm CPB as the gate insulator on PET/ITO substrates with high-conductivity $In_2O_3$ drain/source electrodes: (A) transfer current-voltage characteristics; (B) output characteristics as a function of gate voltage; and (C) Transmission optical spectrum of an array of 30 transparent inorganic-organic hybrid TFTs (PET/ITO/SAS/$In_2O_3$/$In_2O_3$ drain and source electrodes) taken through the $In_2O_3$ drain/source region; transmission optical spectrum of blank PET and normalized transmission optical spectrum of PET/ITO/SAS/$In_2O_3$ (referenced to blank PET) are also shown for comparison.

SUMMARY OF THE INVENTION

Figure 1A:
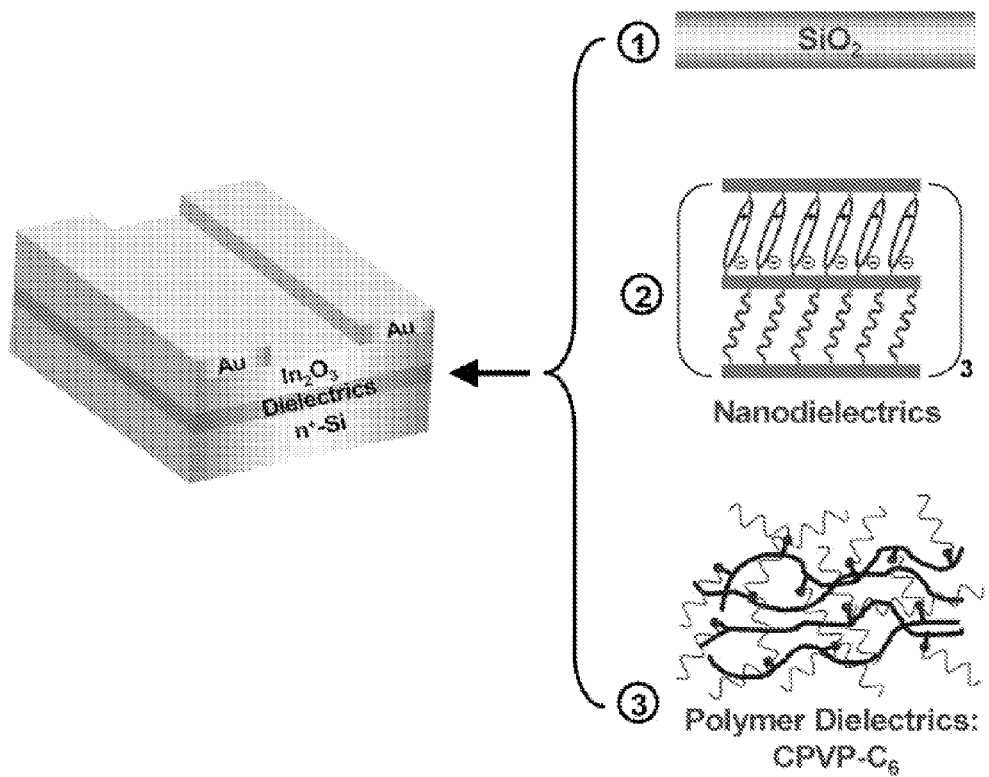
FIGS. 1A-D. Schematic views of TFTs using thin-film metal oxide semiconductors as a channel, showing $In_2O_3$ as one such possible semiconductor material: (A) TFTs on doped-Si gate substrates; the dielectrics include 300 nm thermally-grown $SiO_2$, SAS nanodielectrics (iteratively applied, where n can be, e.g., 3), and cross-linked polymer dielectrics; (B) transparent flexible TFTs using a polymer blend dielectric (see also FIG. 1G), on PET/ITO substrates; (C) TFTs, L (channel length)=50/100 μm, W (channel width)=5 mm, on doped Si gate substrates (left): the dielectrics are 300 nm thermally grown $SiO_2$, a 16.5 nm self-assembled SAS dielectric or a 20 nm CPB dielectric, and drain/source electrodes are Au thin films; fully transparent TFTs on glass/ITO substrates (right): the dielectric is a 16.5 nm self-assembled SAS dielectric, and drain/source electrodes are high-conductivity $In_2O_3$ thin films. (D) Molecular structure of a representative nanoscopic SAS dielectric and its component constituents.

In light of the foregoing, it is an object of the present invention to provide various semiconductor and dielectric components and/or transistor devices and related methods for their production and/or assembly, thereby overcoming various deficiencies and shortcomings of the prior art, including those outlined above. It will be understood by those skilled in the art that one or more aspects of this invention can meet certain objectives, while one or more other aspects can meet certain other objectives. Each objective may not apply equally, in all its respects, to every aspect of this invention. As such, the following objects can be viewed in the alternative with respect to any one aspect of this invention.

It can be an object of the present invention to provide material components, structures and/or device configurations meeting the aforementioned requirements while, in addition, fully realizing the benefits available from TFT technologies.

It can be an object of the present invention, alone or in conjunction with the preceding objective, to provide an inorganic semiconductor component, as can comprise but is not limited to a metal oxide, with favorable performance properties, including crystallinity and field-effect mobilities, as can be available through fabrication at or near room temperatures or at temperatures non-deleterious to temperature-sensitive substrates.

It can be an object of this invention to provide a wide range of organic or inorganic dielectric materials compatible with a variety of substrates, including organic and/or flexible substrates, compatible with a variety of inorganic semiconductors (including both n- and p-type), and enable efficient operation of such semiconductor components.

It can be another object of the present invention, alone or in conjunction with one or more of the preceding objectives, to provide a dielectric component with favorable performance properties including but not limited to capacitance and thermal stability.

It can be another object of the present invention, alone or in conjunction with one or more of the preceding objectives to provide various compatible combinations of such components through the fabrication of a range of transistor configurations and related device structures.

Other objects, features, benefits and advantages of the present invention will be apparent from this summary and the following descriptions of certain embodiments, and will be readily apparent to those skilled in the art having knowledge of thin film transistor devices, transistor components and related assembly/fabrication techniques. Such objects, features, benefits and advantages will be apparent from the above as taken into conjunction with the accompanying examples, data, figures and all reasonable inferences to be drawn therefrom, alone or with consideration of the references incorporated herein.

In part, the present invention can be directed to a transistor device, such a device comprising a substrate, a dielectric component on or coupled to the substrate, and an inorganic semiconductor component. Available substrate materials are known in the art and include, without limitation, various flexible plastics. The inorganic semiconductor component can be coupled to the dielectric component, and the two components together can form a thin film composition. As used herein, "coupled" can mean the simple physical adherence of two materials without forming any chemical bonds (e.g. by adsorption), as well as the formation of chemical bonds (e.g., ionic or covalent bonds) between two or more chemical moieties, atoms, or molecules.

The present semiconductor components can comprise a metal oxide such as but not limited to indium oxide and zinc oxide, as well as other inorganic materials of the sort discussed herein. For instance, such components can comprise other available Group 12 metals, Group 13 metals, Group 14 metals, and Group 15 metals, particularly oxides thereof, as well as nitrides, phosphides, and arsenides thereof, as would be understood by those skilled in the art. In some embodiments, the oxides can include two or more metals. In certain embodiments, the semiconductor component can include two or more different types of metal oxides. Alternatively, from a structural-functional perspective described more fully below, such semiconductor components can comprise a metal oxide providing advantageous field-effect mobilities, such mobilities as can be approached through improved component crystallinity and interfacial and related morphological considerations of the type described herein.

Alternatively, with respect to a broader aspect of this invention, an inorganic semiconductor component can comprise one or more semiconducting metal or metalloid chalcogenides (e.g., sulfides, selenides, tellurides), pnictinides (e.g., gallium, indium, thallium), carbides, halides and the like. The semiconductor component can be deposited/applied at relatively low temperatures (e.g., at room temperature) over relatively large surface areas and combined with a high-capacitance organic gate dielectric, of the sort described herein, which can also be deposited at relatively low temperatures over relatively large surface areas. Such inorganic components are wide ranging (e.g., single crystal Si, amorphous Si, GaAs, and various oxides, nitrides, phosphides and the like) and limited only by their semiconductor function, field-effect mobilities and/or use in conjunction with organic or inorganic dielectric components, such use and dielectric components as described more fully below. Regardless, such a semiconductor can comprise a thin film, wire, nanowire, nanotube or nanoparticle configuration, or as otherwise could function in the context of a particular device structure—such configurations as would be understood by those skilled in the art.

A dielectric component of this invention can be selected from various materials providing favorable capacitance and/or insulating properties. In some embodiments, the dielectric component can include at least one of a multi-layered organic assembly, an organic polymeric composition, and silicon dioxide. Such dielectric components, as would also be understood by those in the art made aware of this invention, In certain non-limiting embodiments, the dielectric component can include a multi-layered organic assembly/composition having periodically alternating layers of different materials. These alternating layers can include one or more layers that include a π-polarizable moiety ("a chromophore layer"), and one or more layers that include a silyl or siloxane moiety ("an organic layer"). At least some of the alternating layers can be coupled by a coupling or capping layer that includes a siloxane matrix.

The π-polarizable moiety can include conjugated π-electrons. In some embodiments, the π-polarizable moiety can include at least one of a dipole moment, an electron releasing moiety, an electron withdrawing moiety, a combination of such moieties, a zwitterion and a net charge. Without limitation, such a component can comprise a non-linear optical (NLO) chromophore. In some embodiments, the chromophore can include a π-conjugated system, which can include a system of atoms covalently bonded with alternating single and multiple (e.g. double) bonds (e.g., C=C—C=C—C and C=C—N=N—C). The π-conjugated system can include heteroatoms such as, but not limited to, nitrogen (N), oxygen (O), and sulfur (S). In some embodiments, the π-conjugated system can include one or more aromatic rings (aryl or heteroaryl) linked by conjugated hydrocarbon chains. In certain embodiments, the aromatic rings can be linked by conjugated chains that include heteroatoms (e.g., azo groups [—N=N—]). For example, the π-polarizable moiety can be a chromophore that includes a stilbazolium moiety. The identity of such compounds are limited only by their electronic/structural features and resulting polarizability in the context of a particular use or application, as illustrated by various representative embodiments described herein.

The organic layers can include a bis(silylated)alkyl moiety (e.g., ranging from about $C_1$ to about $C_{20}$). In particular embodiments, the organic layers can be coupled to the chromophore layers directly or via a coupling or capping layer that includes a siloxane matrix. The coupling can be performed via a condensation reaction or chemisorption using known silyl chemistry. For example, precursors of the silyl moiety and the siloxane moiety can include hydrolyzable groups such as, but not limited to, halo groups, amino groups (e.g., dialkylamino groups), and alkoxy groups. Examples of such precursors can include, but are not limited to, $Cl_3Si(CH_2)_n$ $SiCl_3$, $(CH_3O)_3Si(CH_2)_nSi(OCH_3)_3$, and $(Me_2N)_3Si(CH_2)_n$ $Si(NMe_2)_3$, where n can be an integer in the range of 1-10 (i.e., n can be 1, 2, 3, 4, 5, 6, 7, 8, 9, or 10). As discussed more fully herein, such groups are hydrolyzable to a degree sufficient for substrate sorption or condensation or intermolecular crosslinking via siloxane bond formation under the processing or fabrication conditions employed. Similarly, the π-polarizable moiety can be derivatized to include similar silyl hydrolyzable groups, to allow bond formation with the siloxane capping layer and/or the organic layer. In particular embodiments, the organic layers and the chromophore layers can be individually self-assembled monolayers that include the silyl or siloxane moiety, or the n-polarizable moiety.

In some embodiments, the dielectric component can comprise at least one organic dipolar layer comprising a compound comprising a π-polarizable moiety covalently bonded to or cross-linked with a siloxane bond sequence. In certain embodiments, such a dielectric component can comprise a hydrocarbon layer coupled with silicon-oxygen bonds to such a dipolar layer. In certain other embodiments, such a dielectric component can further comprise at least one siloxane capping layer coupled to such a dipolar layer, with silicon-oxygen bonds. Regarding such embodiments, a siloxane capping layer can be positioned between a dipolar layer and a hydrocarbon layer, coupled to each with silicon-oxygen bonds. Such components are described more fully in co-pending application Ser. No. 11/181,132, filed Jul. 14, 2005, the entirety of which is incorporated herein by reference.

Such a silicon-oxygen bonding sequence can be the condensation product of a hydrolyzable silicon moiety (e.g., without limitation, a halogenated, alkoxylated and/or carboxylated silyl moiety) and a hydroxyl functionality. As understood in the art and explained more fully in one or more of the references incorporated herein, such a bonding sequence can derive from use of starting material compounds for the respective dielectric layers, such compounds substituted with one or more hydrolyzable silicon moieties, hydrolysis of such a moiety under self-assembly conditions, and condensation with a subsequent layer starting material or precursor compound.

Precursor compounds which can be incorporated into such layers can include, for instance, bis-trichlorosilyloctane, octachlorotrisiloxane and 4-[[(4-(N,N-bis((hydroxy)ethyl)amino]-phenyl]azo]-1-(4-trichlorosilyl)benzyl-pyridinium iodide, such compounds condensed one with another, with corresponding layers assembled to provide dielectric components in accordance with this invention.

While several of the aforementioned dielectric component compounds, layers and moieties are illustrated in the aforementioned incorporated reference, various other component compounds and associated moieties are contemplated within the scope of this invention, as would be understood by those skilled in the art made aware thereof. For instance, without limitation, various other π-polarizable component compounds and associated moieties are described in U.S. Pat. No. 6,855,274, in particular the NLO structures of FIGS. 1-2, 11, 13 and 15 thereof, U.S. Pat. No. 6,549,685, in particular FIGS. 2-3 thereof, and U.S. Pat. No. 5,156,918, in particular the structures of FIGS. 4-5 thereof, each with reference to the corresponding specification regarding alternate embodiments synthesis and characterization, each of which is incorporated herein by reference in its entirety. Further, as would be understood by those skilled in the art, various other non-linear optical chromophore compounds are described in "Supramolecular Approaches to Second-Order Nonlinear Optical Materials. Self-Assembly and Microstructural Characterization of Intrinsically Acentric [(Aminophenyl)azo]pyridinium Superlattices", Journal of American Chemical Society, 1996, 118, 8034-8042, which is hereby incorporated by reference in its entirety. Such layer component compounds can be used, as described herein, with a variety of difunctionalized hydrocarbon layer and/or siloxane capping layer component compounds, such compounds without limitation as to hydrocarbon length or degree of functionalization capable of condensation with a suitable substrate and/or various other dielectric layers or components in accordance with this invention.

In certain embodiments, the multi-layered dielectric component can also include one or more layers that include an inorganic moiety ("an inorganic layer"). The inorganic layers can periodically alternate among the organic layers and the chromophore layers, and can include one or more main group and/or transition metals. For example, the metal(s) can be selected from a Group 3 metal, a Group 4 metal, a Group 5 metal, and a Group 13 metal. In particular embodiments, the main group metal(s) can be selected from a Group 13 metal such as, but not limited to, gallium (Ga), indium (In), and thallium (Tl) etc., and the transition metal can be selected from a Group 3 metal such as, but not limited to, ittrium (Y), a Group 4 metal such as, but not limited to, titanium (Ti), zirconium (Zr), and hafnium (Hf), and a Group 5 metal, such as but not limited to, tantalum (Ta).

In some embodiments, the dielectric component can comprise a dielectric polymeric component and optionally a silylated component comprising a moiety, e.g., an alkyl group or a haloalkyl group, linking two or more silyl groups having hydrolyzable moieties. Various other linking moieties will be recognized in the art, limited only by structure or functionality precluding intermolecular siloxane bond and matrix formation. The range of the hydrolyzable silyl groups will be known by those skilled in the art made aware of this invention, and include but are not limited to groups such as trialkoxysilyl, trihalosilyl, dialkoxyhalosilyl, dialkylhalosilyl, dihaloalkylsilyl and dihaloalkoxysilyl. Such polymeric compositions are described more fully in co-pending application Ser. No. 60/638,862, filed Dec. 23, 2004, the entirety of which is incorporated herein by reference.

In certain non-limiting embodiments, a bis(silylated) component can comprise an alkyl moiety ranging from about $C_1$ to about $C_{20}$, linking two trihalosilyl groups, two trialkoxysilyl groups or a combination thereof. As discussed more fully herein, such groups are hydrolyzable to a degree sufficient for substrate sorption or condensation or intermolecular crosslinking via siloxane bond formation under the processing or fabrication conditions employed. Regardless, the polymeric component of such compositions can be selected from a range of such dielectric polymers otherwise used in the art as separate gate insulator materials or layers in OTFT fabrication. For purpose of example only, dielectric polymers can include poly(vinylphenol), polystyrene and copolymers thereof. In some embodiments, such polymeric compositions can be crosslinked. Such compositions of this invention are limited only by the availability of suitable silylated components and polymeric dielectric components, the mixture or miscibility thereof one with another for device fabrication, and the resulting polymer-incorporated siloxane-bonded matrix/network and corresponding dielectric/insulator function.

From a device perspective, in certain non-limiting embodiments, this invention can comprise various high-performance inorganic-organic hybrid TFTs fabricated, for example, with semiconducting thin-films as the n-channel or p-channel material and a range of thin organic dielectrics. Alternatively, in other embodiments, TFTs can also comprise inorganic dielectrics such as but not limited to $SiO_2$. As shown below, representative $In_2O_3$ films can be deposited at room temperature by ion-assisted deposition (IAD) sputtering, and all TFTs can be fabricated at room/near-room temperatures. Semiconducting $In_2O_3$ films, organic dielectrics, and TFT device structures were characterized in detail. It is found that inorganic semiconductor components with sufficient microstructural crystallinity exhibit n-type or p-type field-effect behavior, and thin organic (or, e.g. $SiO_2$) dielectric components with sufficient insulating properties enable ultra-low-voltage TFT operation. Such hybrid TFTs can show exceptionally large field-effect mobilities of >100 $cm^2/V$ s at low operating voltages (1~2 V). Furthermore, such a fabrication approach is shown to be applicable to transparent flexible plastic substrates, as well as other temperature-sensitive substrate materials.

As such, one aspect of the invention therefore is directed to a TFT device that includes a substrate (including a substrate-gate material such as, but not limited to, doped-silicon wafer, tin-doped indium oxide on glass, tin-doped indium oxide on mylar film, and aluminum on polyethylene terephthalate), a dielectric material as described herein deposited on the substrate/substrate-gate, a semiconductor material deposited on the dielectric material, and source-drain contacts. In some embodiments, the TFT can be a transparent TFT including one or more of the followings: a transparent or substantially transparent substrate, a transparent or substantially transparent gate conductor, a transparent or substantially transparent inorganic semiconductor component, a transparent or substantially transparent dielectric component, and transparent or substantially transparent source and drain contacts. As used herein, "transparent" refers to having at least a 90% transmittance in the visible region of the spectrum, and "substantially transparent" refers to having at least 80% transmittance in the visible region of the spectrum.

DETAILED DESCRIPTION OF CERTAIN EMBODIMENTS

Throughout the description, where compositions are described as having, including, or comprising specific components, or where processes are described as having, including, or comprising specific process steps, it is contemplated that the compositions also consist essentially of, or consist of, the recited components, and that the processes also consist essentially of, or consist of, the recited processing steps.

In the application, where an element or component is said to be included in and/or selected from a list of recited elements or components, it should be understood that the element or component can be any one of the recited elements or components and can be selected from a group consisting of two or more of the recited elements or components.

The use of the singular herein includes the plural (and vice versa) unless specifically stated otherwise. In addition, where the use of the term "about" is before a quantitative value, the invention also includes the specific quantitative value itself, unless specifically stated otherwise.

It should be understood that the order of steps or order for performing certain actions is immaterial so long as the method remains operable. Moreover, two or more steps or actions can be conducted simultaneously.

Various embodiments of this invention can be considered in light of the following: dielectric and semiconductor TFT components, and related parameters for evaluating TFT performance, such as the field-effect mobility ($\mu$) and the drain-source current on/off ratio ($I_{on}:I_{off}$). High $\mu$ values lead to large drain current, fast charged/discharged capacitive loads, high operating speeds, and thus enable wide range of applications. $I_{on}$ and $I_{off}$ are the gate-controlled drain-source current ($I_{DS}$). $I_{DS}$ in the saturation region is expressed by Equation 1, where W and L are the channel width and length, respectively, $V_T$ is the threshold voltage, and $C_i$ is the dielectric capacitance per unit area. The threshold voltage $V_T$ is defined as the $V_G$ at which a device switches from the off state to the on state, and vice versa. Ideally, $V_T$ should be minimal (e.g., 0.0V) to minimize power consumption. $C_i$ is expressed by Equation 2, where k is the dielectric constant, $\epsilon_o$ is the vacuum permittivity, and d is the dielectric thickness.

$$I_{DS} = \frac{WC_i\mu}{2L}(V_G - V_T)^2 \quad (1)$$

$$C_i = \frac{k\varepsilon_0}{d} \quad (2)$$

Note that for a certain device geometry, a given $I_{DS}$ can be achieved at lower operating bias by increasing $\mu$ in the semiconductor or increasing $C_i$ in the dielectric. However, previous efforts have only focused on one or the other of these parameters. To simultaneously achieve a large $\mu$ and a large $C_i$, suitable semiconductors and dielectrics are needed, with sufficient compatibility therebetween.

Metal oxides are a class of semiconductor or component materials for transparent flexible TFTs. The attraction of metal oxides includes high mobility, wide band gap, broad visible window, controllable electrical properties, and room-temperature growth. So far, metal-oxide-based TFTs have not been optimized, and the majority of metal-oxide-based TFTs demand either high growth temperatures or post-annealing treatment (usually >500° C.) in order to improve the crystallinity and therefore the field-effect mobility. However, high-temperature processing prevents applications in most flexible (polymer-based) electronics. Previous metal-oxide-based TFTs fabricated at room temperature exhibit poor performance, in particular low field-effect mobilities, low $I_{on}:I_{off}$ ratios and large operating voltages, any of which tend to preclude most practical applications. Moreover, conventional growth techniques tend to be incompatible with practical large-area/scale deposition and device fabrication.

$In_2O_3$ is a promising n-type material having a wide band gap (3.6~3.75 eV), high mobility as single crystals (160 $cm^2$/V s), considerable transparency in the visible region (>90%), but has not been used previously to fabricate TFT devices. See, respectively, Radha Krishna, B.; Subramanyam, T. K.; Srinivasulu Naidu, B.; Uthanna, S. *Opt. Mater.* 2000, 15, 217; Weiher R. L.; Ley, R. P. *J. Appl. Phys.* 1966, 37, 299; Weiher, R. L. *J. Appl. Phys.* 1962, 33, 2834; Wang, L.; Yang, Y.; Marks, T. J.; Liu, Z.; Ho, S.-T. *Appl. Phys. Lett.* In press. On the other hand, thin organic dielectrics (e.g., self-assembled multilayer and cross-linked polymer nanodielectrics) have been proved to remarkably effective in enhancing the response characteristics of organic TFTs properties, while exhibiting good transparency in visible region. As demonstrated below, the efficient incorporation of inorganic $In_2O_3$ semiconductors and thin organic dielectrics—both at room temperatures using scalable growth processes—can provide transparent flexible TFTs with high mobility, good optical transparency, and low-voltage operation.

Figure 1B:
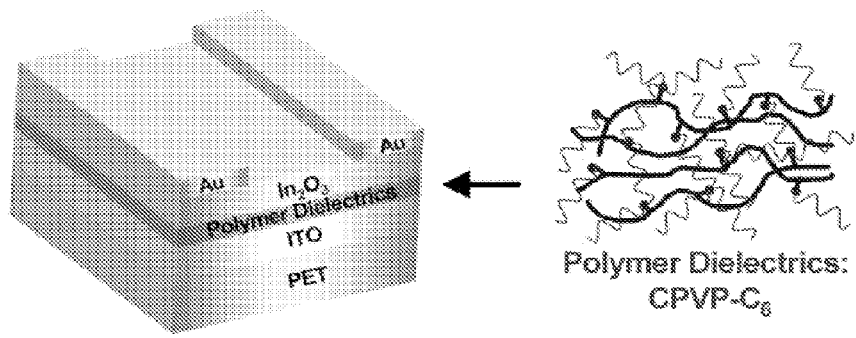

Representative top-contact TFT device structures are shown in FIGS. 1A-B. $In_2O_3$ thin films were deposited on inorganic dielectrics ($SiO_2$) and organic dielectrics by room-temperature IAD sputtering, a representative deposition technique. Organic dielectrics were fabricated on $n^+$-doped Si (100) wafers and transparent flexible ITO/PET substrates (as the back gate; where ITO denotes tin-doped indium oxide) via either solution phase spin coating or layer-by-layer self-assembled techniques. Finally, conducting source and drain electrodes (e.g., from Au, ITO, and other suitable materials known in the art) were patterned through shadow masks, using techniques known in the art.

Figure 1C:
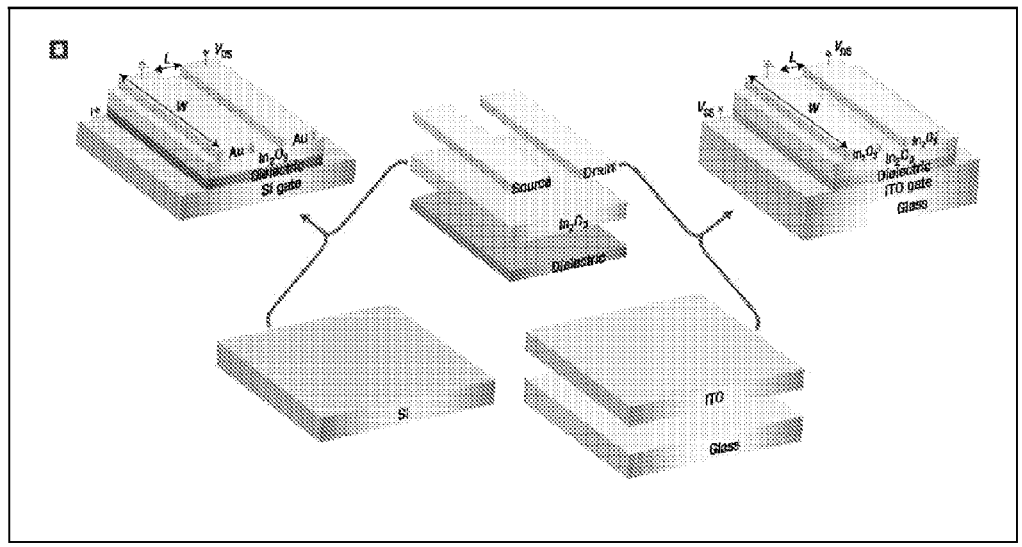
Figure 1D:
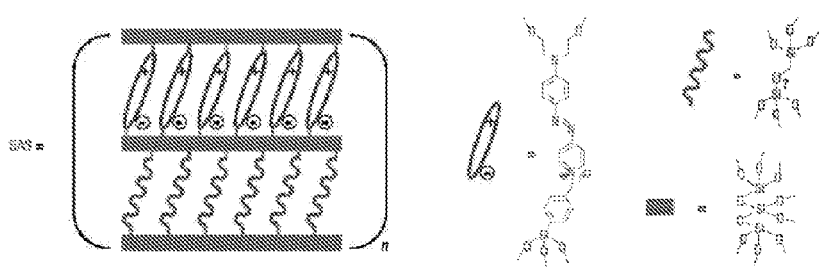

The structures and components of other hybrid TFTs are illustrated in FIGS. 1C-D, with all components deposited at room temperature. For comparison, $In_2O_3$ TFTs were also fabricated in combination with a conventional 300 nm $SiO_2$ dielectric layer. The semiconducting $In_2O_3$ thin films, thin nanoscopic dielectrics, TFT device structures and electrical properties were characterized as described below. Such hybrid TFTs have exceptionally large field-effect mobilities of 140 cm2 $V^{-1}$ $s^{-1}$ at low operating voltages (~1V) with good $I_{on}/I_{off}$ ratios. Furthermore, this fabrication approach is applicable to glass substrates to realize "invisible" TFTs. Different FET device structures can be fabricated according to the teachings herein, including bottom-contact and bottom-gate structures, top-gate top-contacts structures, top-gate bottom-contacts structures, and bottom-gate top-contacts structures.

As understood in the art, IAD applies two ion beams to simultaneously effect film deposition, oxidation, and crystallization, leading to smooth, dense, coherent films at room temperature. Meanwhile, the assisted ion beam realizes a pre- and in-situ cleaning/activation process, producing fresh surfaces, creating strong interfacial adhesion, and achieving full oxidation state/stoichiometry. Thus, IAD is capable of growing high-quality thin films on organic/plastic substrates. Another attraction of IAD is that the electrical properties of resulting films can be finely/readily engineered via control of the growth system oxygen partial pressure and ion beam power during the film growth process. For instance, the room-temperature Hall mobilities of the IAD-derived $In_2O_3$ films (FIG. 2C) are substantial and nearly constant as carrier concentration is varied over the broad range of $10^{17}$-$10^{20}$ $cm^{-3}$. For useful semiconduction (low $I_{off}$), $In_2O_3$ thin films are deliberately grown to be highly resistive, indicating that the carrier concentration can be efficiently suppressed by IAD. Under these growth conditions, the conventional Hall effect mobility is immeasurable by conventional techniques because of the low carrier density. The conductivity of $In_2O_3$ thin films is estimated to be ~$10^{-4}$-$10^{-5}$ S/cm, and the carrier concentration is ~$10^{13}$~$10^{14}$ $cm^{-3}$, as derived from the field effect mobility.

Figure 2A:
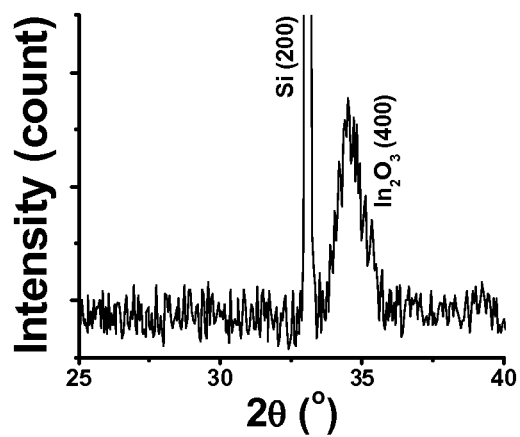
FIGS. 2A-D. X-ray diffraction θ-2θ scans of $In_2O_3$ thin films from three TFT structures: (A) $p^+$-Si/$SiO_2$/$In_2O_3$; (B) $n^+$-Si/(SAS nanodielectric)/$In_2O_3$; (C) $n^+$-Si/(polymer dielectric)/$In_2O_3$; and (D) Hall-effect mobility versus carrier density.
Figure 2B:
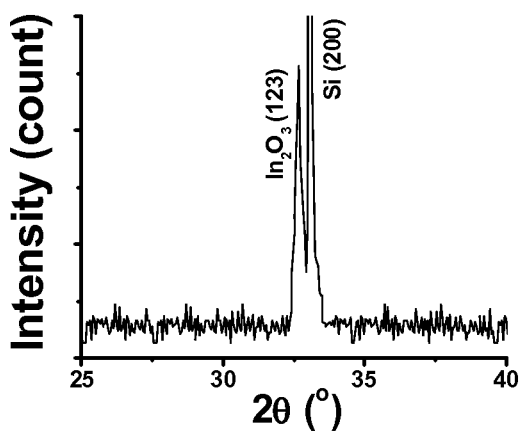
Figure 2C:
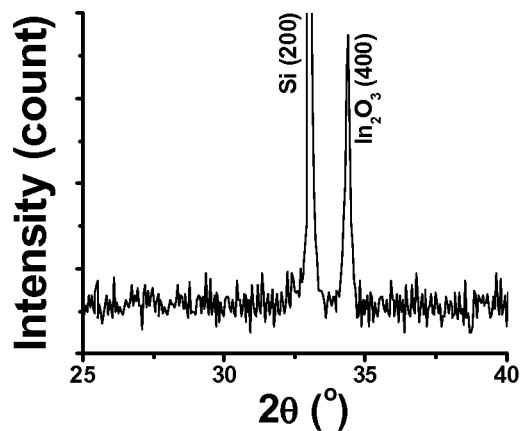
Figure 2D:
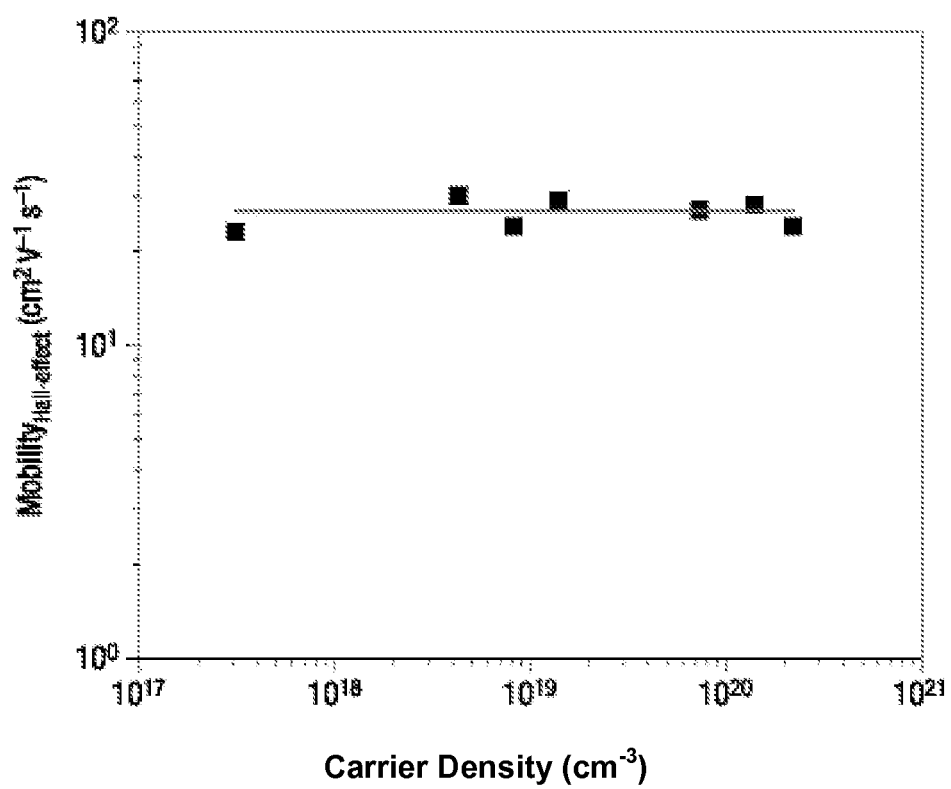
Figure 3A:
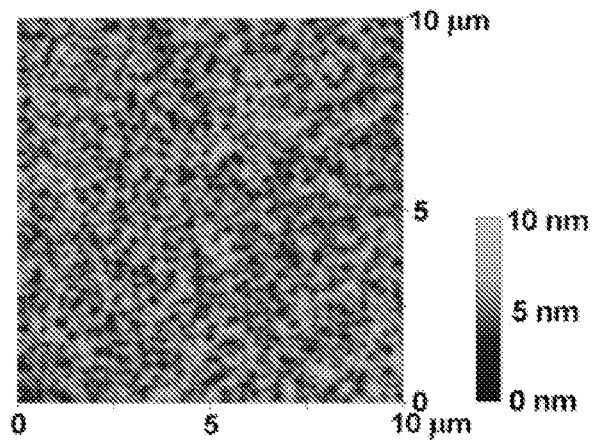
FIGS. 3A-C. AFM images of $In_2O_3$ thin films from three TFT structures: (A) $p^+$-Si/$SiO_2$/$In_2O_3$; (B) $n^+$-Si/(SAS nanodielectric)/$In_2O_3$; (C) $n^+$-Si/polymer dielectric/$In_2O_3$.
Figure 3B:
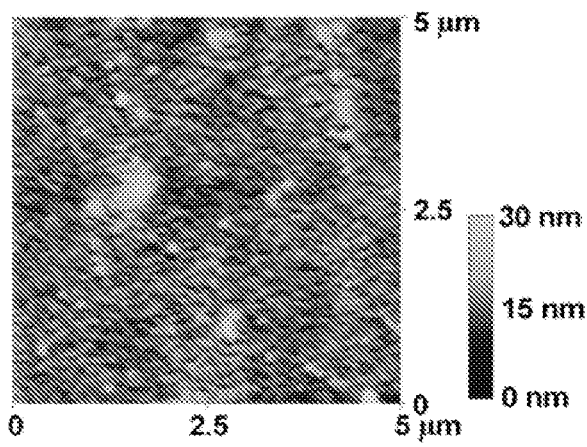

X-ray diffraction (XRD) $\theta$-$2\theta$ scans of $In_2O_3$-based TFTs (without Au source and drain electrodes) reveal that the $In_2O_3$ films possess considerable crystallinity (i.e., cubic bixebyte structure) when grown on $SiO_2$ (FIG. 2A), and that films on $p^+$-Si/(thin organic (e.g., SAS) dielectric) exhibit even stronger textured crystallinity judging from the peak widths of the dominant XRD peaks (FIGS. 2B and 2C). Crystallinity strongly/positively influences the field effect mobility and TFT device performance, and thus is desired in the semiconducting channel materials. With this microstructural crystallinity, an $In_2O_3$ semiconductor thin film can be used effectively as a channel material in certain TFT embodiments.

The surface morphologies and grain sizes of IAD-derived $In_2O_3$ thin films were examined by contact-mode AFM and images are shown in FIGS. 3A-D. The $In_2O_3$ thin films grown on the different dielectric substrates are compact, dense, uniform, and smooth, and exhibit low RMS roughnesses, e.g., RMS=0.7-0.8 nm on Si/$SiO_2$, 1.6-1.8 nm on the Si/organic (SAS) dielectric, 2.7-3.1 nm on Si/cross-linked polymer dielectric, and 1.9-2.1 on glass/ITO/SAS. Low roughness can be attributed to: (1) the smooth underlying dielectric (whether organic or inorganic), which is further supported by AFM; and (2) the intrinsic efficacy of the IAD growth technique to deposit smooth films.

Figure 4A:
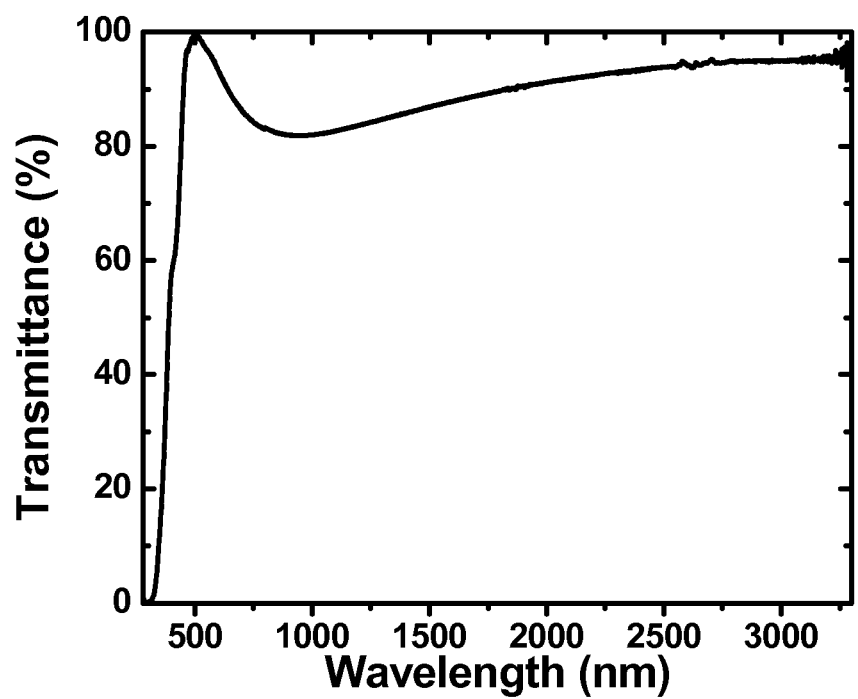
FIGS. 4A-B. Optical characteristics of 120 nm as-deposited $In_2O_3$ thin films on clean Eagle 2000 glass: (A) Optical transmittance spectrum; (B) derivation of the optical band gap.
Figure 4B:
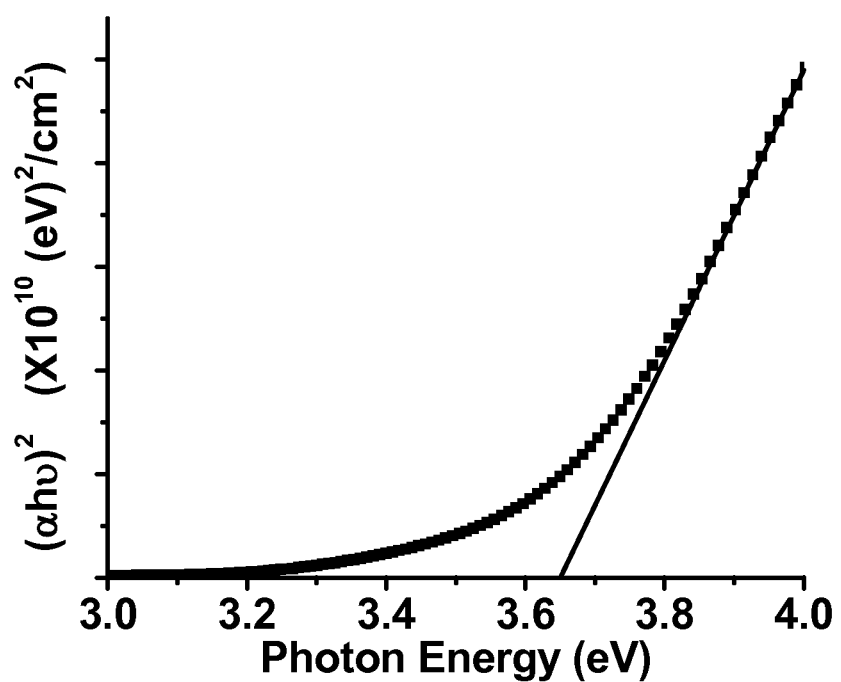

All the present as-grown $In_2O_3$ films are colorless and highly optically transparent, and the films on the glass show an average transparency of ~90% in visible region (FIG. 4A). The direct optical band gap was investigated and estimated from the optical transmittance spectrum by extrapolating the linear part of the plot of $(\alpha h\upsilon)^2$ versus $h\upsilon$ to $\alpha=0$. Band gap data shows a typical value of 3.65 eV for the IAD-derived $In_2O_3$ films (FIG. 4B). Transmittance and band gap results suggest that $In_2O_3$ thin films are ideal re-channel materials for transparent TFT fabrication. The room-temperature growth process expands the application of $In_2O_3$ semiconductors to transparent flexible substrates.

Organic dielectrics were fabricated (e.g., self-assembled or spin-coated) by solution-phase-based growth techniques, leading to good smoothness, strong adhesion, good thermal stability, pin-hole-free and remarkable electrical insulating characteristics. For instance, self-assembled superlattice (SAS) nanodielectrics, of the type described more fully in several of the incorporated references, exhibit a large capacitance of 180 $nF/cm^2$, an effective dielectric constant of 4.7, leakage current as low as $10^{-13}$ pA, and breakdown fields as high as 4 MV/cm, as determined from the capacitance measurement. As a result, thin organic dielectrics promise TFT operation at very low gate and drain-source voltages. Note that such thin organic dielectrics are mechanically/chemically robust, and careful control of the IAD growth process ensures that such dielectric materials survive the ion/plasma exposure during metal oxide deposition.

Figure 5:
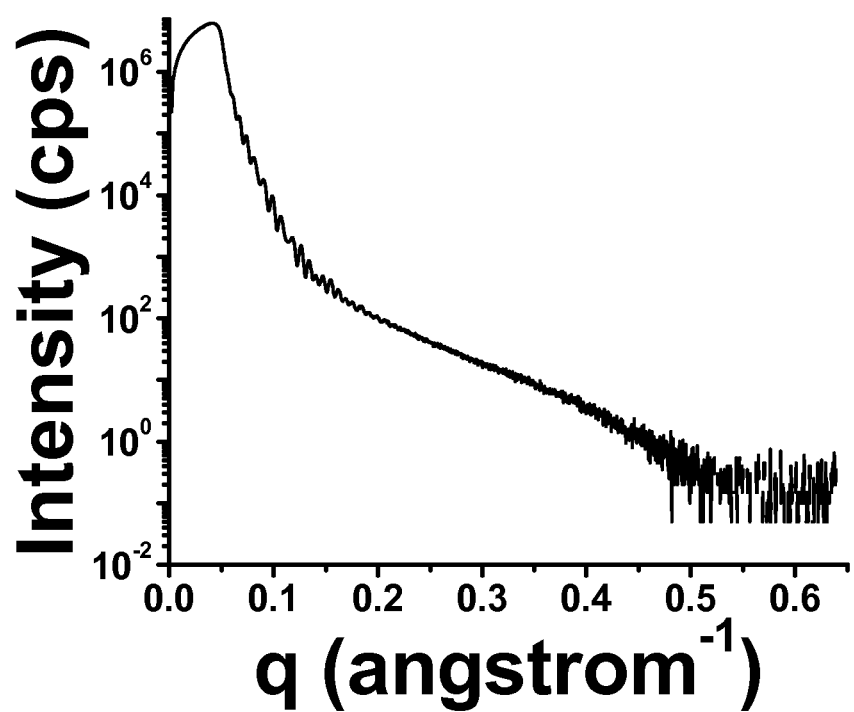
FIG. 5. X-ray reflectivity of $n^+$-Si/(SAS nanodielectric)/$In_2O_3$ films using an asymmetric Ge(111) compressor.
Figure 6:
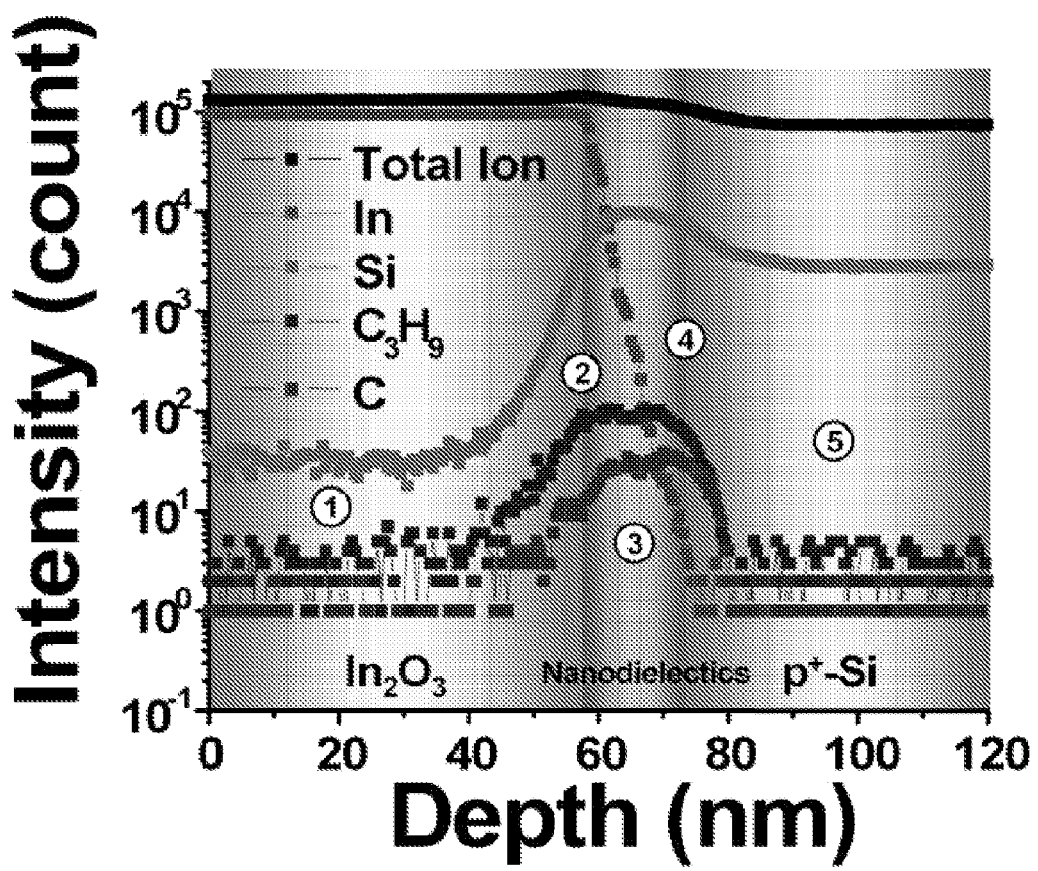
FIG. 6. Secondary ion mass spectrum (SIMS) depth profile of inorganic-organic hybrid TFTs: $n^+$-Si/(SAS nanodielectric)/$In_2O_3$.
Figure 7:
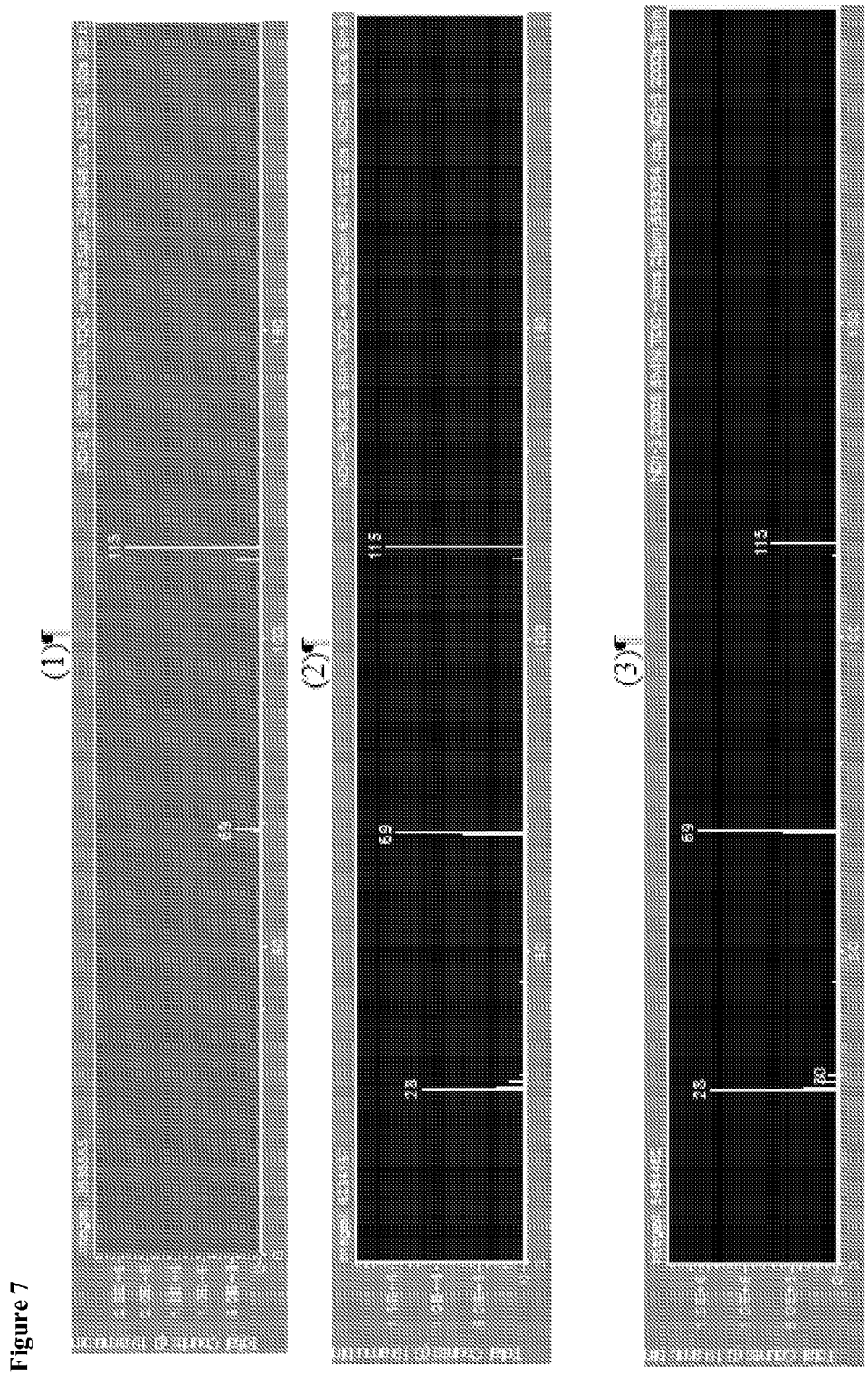
FIG. 7. SIMS spectra of inorganic-organic hybrid TFTs: $n^+$-Si/(SAS nanodielectric)/$In_2O_3$. The labeling of each spectrum corresponds to the numbers in FIG. 6. Note that the peak of 69 is from $Ga^+$ ion source.
Figure 7:
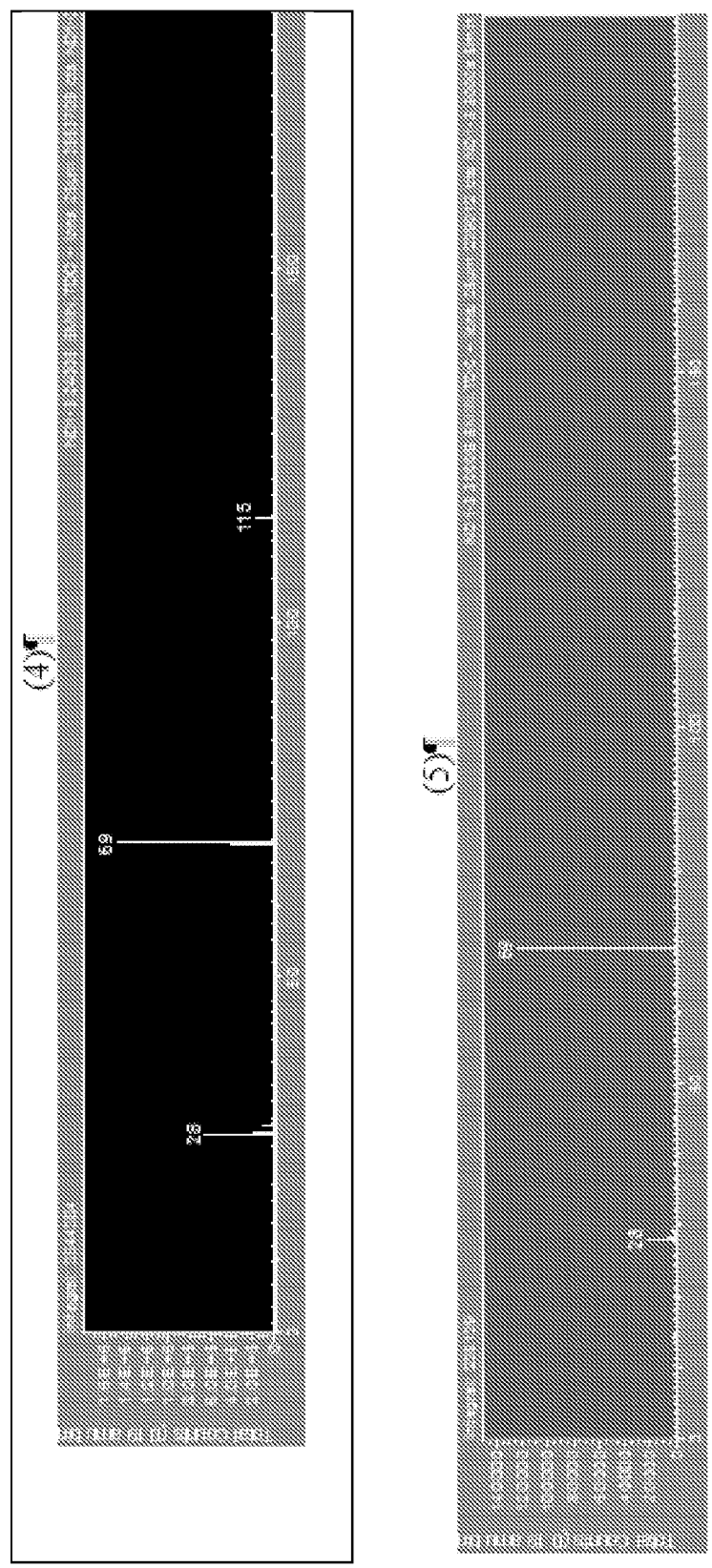

The multilayer structures and composition of the present hybrid TFTs with the device structure of $n^+$-Si/(SAS nanodielectrics)/$In_2O_3$ were investigated by X-ray reflectivity (XRR) (FIG. 5) and secondary ion mass spectroscopy (SIMS) quantitative in-depth analysis (FIGS. 6 and 7). The XRR fringe pattern persists to large q values (as much as q=0.3), qualitatively demonstrating smooth interfaces of hybrid TFTs. In addition, SIMS depth profile results and spectra show these devices have abrupt $In_2O_3$-dielectric interfaces, minimal interfacial cross-diffusion, and phase purity. Clean interfaces in principle minimize electron traps and hysteresis, and should thereby enhance $\mu_{FE}$. Generally, weak adhesion between inorganic and organic interfaces is a significant factor degrading organic field-effect transistor performance and stability. For the present devices, the conventional 'Scotch tape' adhesion test reveals no detectable change in multilayer thickness, optical microscopic images or optical transparency before and after the test, indicating that IAD-grown $In_2O_3$ films on the organic dielectrics exhibit strong interfacial adhesion.

Figure 8A:
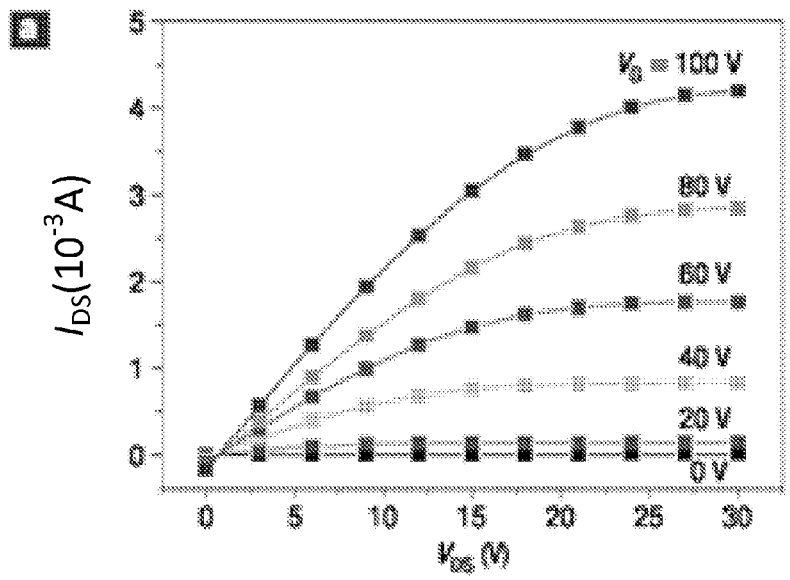
FIGS. 8A-G. Field-effect device characteristics of inorganic-only TFTs on p+ Si substrates and inorganic-organic hybrid TFTs on n+ Si substrates and Corning 1737F glass substrates; (A-B), Field-effect device characteristics of inorganic-only TFTs on p+ Si substrates: current-voltage output characteristics as a function of gate voltage (A); TFT transfer characteristics of current versus gate voltage (B) (thin-film $In_2O_3$ as the semiconductor (100 μm (L)×5 mm(W)) and 300 nm $SiO_2$ as the gate dielectric, with Au drain/source electrodes). C,D, Field-effect device characteristics of inorganic-organic hybrid TFTs on n+ Si substrates: current-voltage output characteristics as a function of gate voltage (C); TFT transfer characteristics of current versus gate voltage (D) (thin-film $In_2O_3$ as the semiconductor (50 μm (L)×5 mm(W)) and a 16.5 nm SAS dielectric with Au drain/source electrodes). E-F, Field-effect device characteristics of inorganic-organic hybrid TFTs on Corning 1737F glass substrates: current-voltage output characteristics as a function of gate voltage (E); TFT transfer characteristics of current versus gate voltage (F) (thin-film $In_2O_3$ as the semiconductor (100 μm (L)×5 mm(W)) and a 16.5 nm SAS dielectric with Au drain/source electrodes). (G), Comparison of TFT transfer current as a function of accumulated charge-carrier density: p+ Si/$SiO_2$/$In_2O_3$/Au (left) and n+ Si/SAS/$In_2O_3$/Au (right). Note that inspection of the plots reveals possible contact resistance effects, indicating that performance might be enhanced by contact optimization.
Figure 8B:
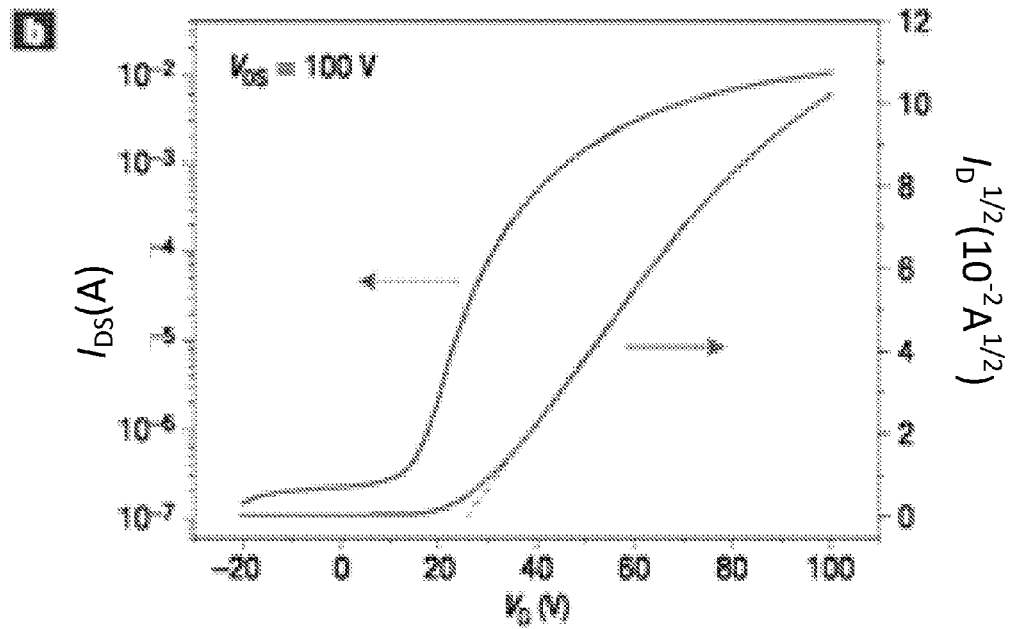
Figure 8C:
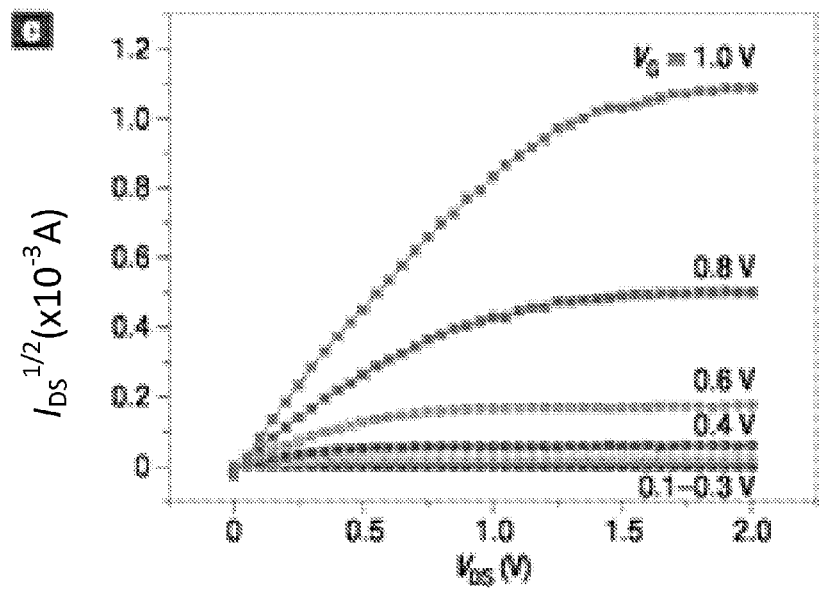
Figure 8D:
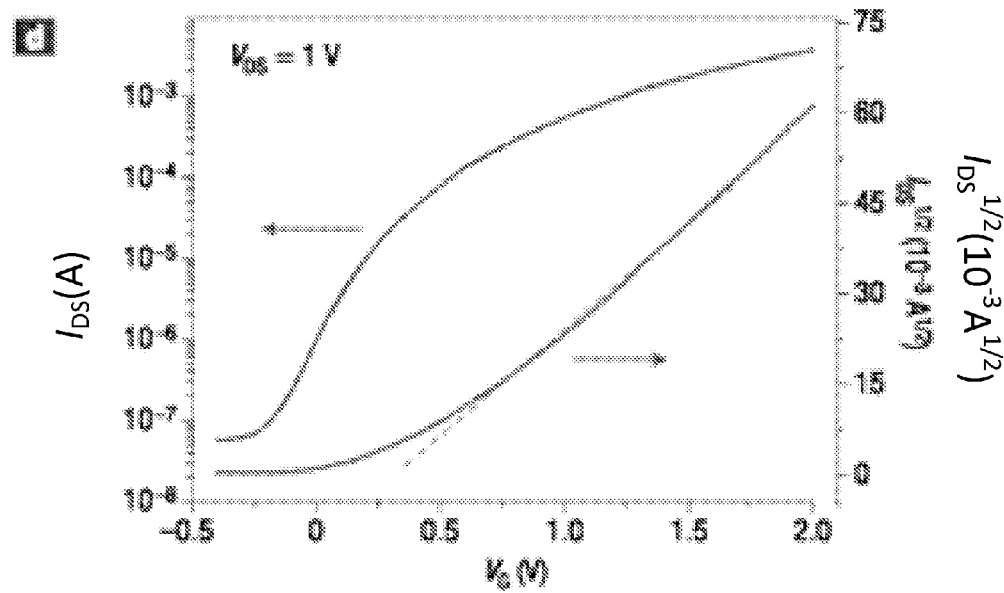
Figure 8E:
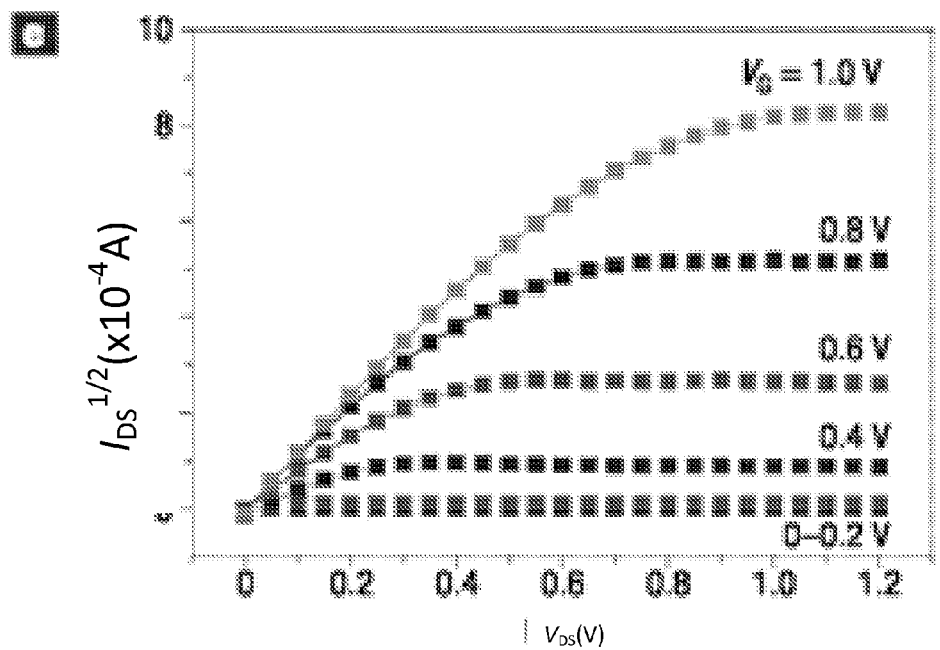
Figure 8F:
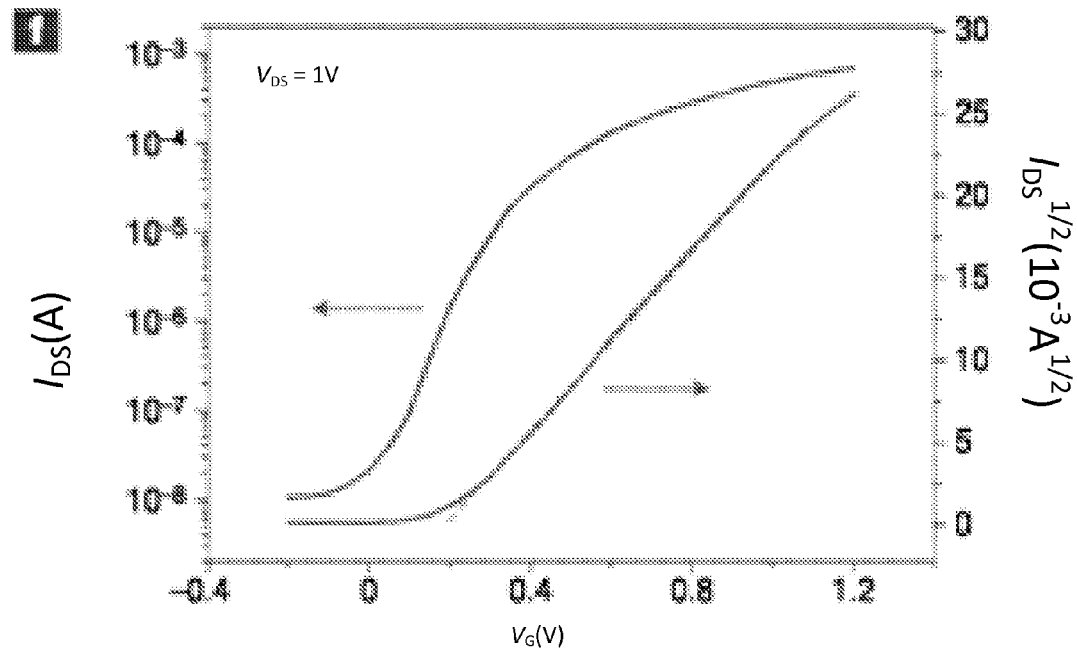

$In_2O_3$-based TFTs were first characterized on $p^+$-Si substrates having a conventional $SiO_2$ dielectric, next on $n^+$-Si substrates with the SAS and CPB dielectrics (FIGS. 8A-E), and then on glass/indium tin oxide (ITO) substrates with the SAS dielectric (FIGS. 8E-F and 5). TFT device response parameters are summarized in Table 1. The $In_2O_3$ devices using $SiO_2$ gate dielectrics show reasonable field-effect responses ($\mu_{FE}$=10 $cm^2$ $V^{-1}s^{-1}$; $I_{on}/I_{off}$=$10^5$) with operating voltages in the 100 V range (FIGS. 8A-B, Table 1). In contrast, inorganic-organic hybrid TFTs fabricated on $n^+$-Si/SAS substrates exhibit excellent I-V characteristics (FIGS. 8C-D, Table 1) with classical/crisp pinch-off linear curves and saturation lines at very low operating voltages. Low operating voltages (~1V) are essential for mobile electronics powered by simple household batteries.

TABLE 1

Materials and device parameters for TFTs fabricated from $In_2O_3$ thin films + $SiO_2$ or nanoscopic organic SAS*/CPB† dielectrics on Si and glass/ITO gates using Au or $In_2O_3$ drain and source electrodes.

| | Gate | $In_2O_3$ thickness (nm) | Dielectric/thickness (nm)/$C_i$ (nF $cm^{-2}$) | D & S electrodes |
|---|---|---|---|---|
| 1. | $p^+$-Si | 120 | $SiO_2$/300/10 | Au |
| 2. | $n^+$-Si | 60 | SAS*/16.5/180 | Au |
| 3. | $n^+$-Si | 60 | CPB†/20/250 | Au |
| 4. | Glass/ITO | 60 | SAS*/16.5/180 | Au |
| 5. | Glass/ITO | 60 | SAS*/16.5/180 | $In_2O_3$ |

| | $\mu_{FE}$ ($cm^2V^{-1}s^{-1}$) | $\mu_{GB}$‡ ($cm^2V^{-1}s^{-1}$) | $I_{on}/I_{off}$ | $V_t$ (V) | $N_t$§ ($cm^{-2}$) | S (V per decade) |
|---|---|---|---|---|---|---|
| 1. | 10 | 24 | $10^5$ | 23 | $1.73 \times 10^{12}$ | 5.6 |
| 2. | 140 | 178 | $10^5$ | 0.33 | $2.33 \times 10^{11}$ | 0.15 |
| 3. | 80 | 94 | $10^3$ | 0 | $2.79 \times 10^{11}$ | 0.41 |
| 4. | 140 | 181 | $10^5$ | 0.17 | $2.44 \times 10^{11}$ | 0.08 |
| 5. | 120 | 154 | $10^5$ | 0.19 | $2.51 \times 10^{11}$ | 0.09 |

*SAS = Self-assembled superlattice dielectric.
†CPB = Poly-4-vinylphenol + 1,6-bis(trichlorosilyl)hexane dielectric.
‡$\mu_{GB}$ = Grain-boundary mobility.
§$N_t$ = Trap density.

Analysis of the $n^+$-Si/SAS/$In_2O_3$ device electrical response reveals large saturation-regime field-effect mobilities of ~140 $cm^2$ $V^{-1}s^{-1}$, encouraging for high-speed applications. Such mobilities are ~10× greater than previously reported for metal oxide TFTs fabricated at room temperature, and are attributed to the following: (1) substantial crystallinity of the IAD-derived $In_2O_3$ semiconductor, verified by the XRD results and grain-boundary trapping model analysis (vide infra), and the resulting suppressed neutral impurity scattering, (2) very small values of the interfacial trap density ($N_t$~$10^{11}$ $cm^{-2}$, Table 1), (3) minimal ionized-impurity scattering (the carrier concentration is ~$10^{13}$-$10^{14}$ $cm^{-3}$) (4) strong adhesion and smooth, abrupt semiconductor/dielectric interfaces to minimize electron traps and (5) advantageous characteristics of the high-capacitance organic nanoscopic dielectrics. The threshold voltage $V_T$ of the present devices is close to 0.0 V, with nearly hysteresis-free response and minimal trapped charge. That electrons are generated by a positive gate bias $V_G$, verifies that $In_2O_3$ shows n-channel behavior. Furthermore, $I_{on}/I_{off}$ ratios of ~$10^5$ are achieved, and the maximum drain-source current reaches the mA level, sufficient for most portable circuit applications. Small subthreshold gate voltage swings of 150 mV per decade (Table 1) are achieved at the maximum slope for devices fabricated with the SAS dielectric (FIG. 8D).

Figure 8G:
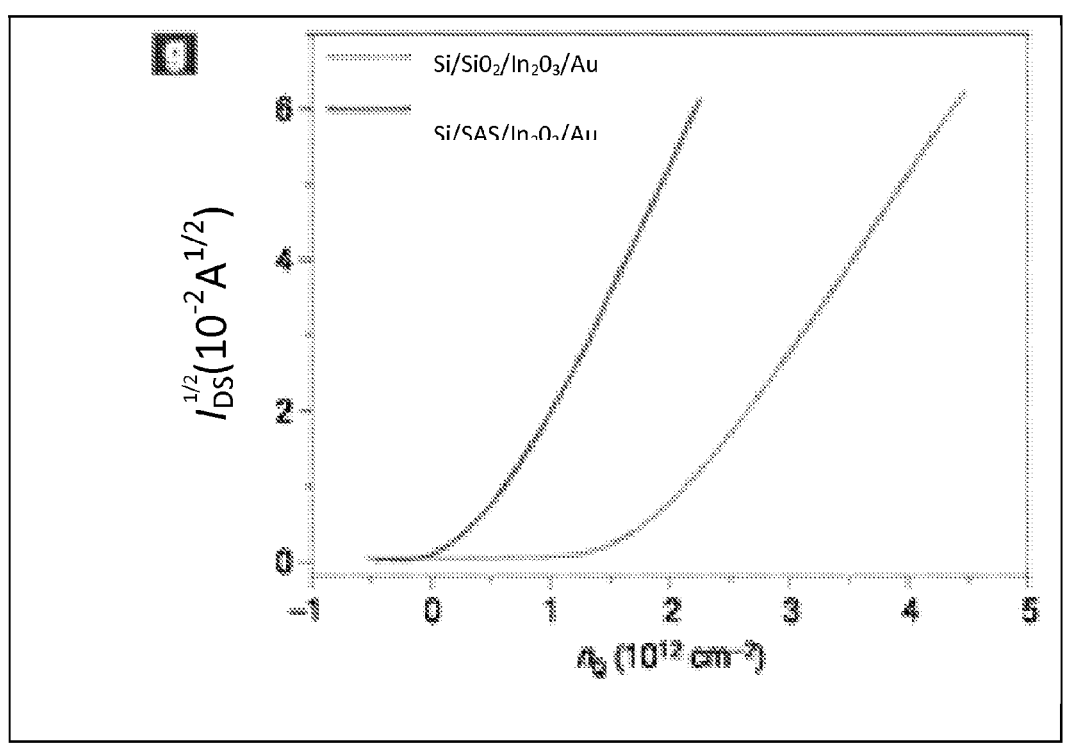

To correct for the differences in the different dielectric layers (for example capacitance, thickness and applied bias), the TFT transfer current characteristics are plotted versus accumulated charge carrier density (FIG. 8G). It can be seen that the $n^+$-Si/SAS/$In_2O_3$/Au hybrid devices switch on at much lower accumulated charge carrier densities than the inorganic-only $p^+$-Si/SiO2/$In_2O_3$/Au devices, revealing that electron mobilities and charge-injection efficiency between the $In_2O_3$ channel and drain/source electrodes are markedly greater in the hybrid TFT case.

To further investigate the generality and applicability of the present inorganic-organic hybrid TFT strategy, $In_2O_3$ TFTs were next fabricated on $n^+$-Si/(20 nm CPB dielectric) with Au source and drain electrodes. These $n^+$-Si/CPB/$In_2O_3$ devices also have good field-effect electrical response with field-effect mobilities of ~80 $cm^2$ $V^{-1}$ $s^{-1}$, $I_{on}/I_{off}$ ratios of $10^3$, and low $V_T$~0.0 V. Next, using the same fabrication techniques, hybrid TFTs were grown at room temperature on glass/IAD- ITO/SAS gate structures with Au drain/source electrodes (FIGS. 8E-F, Table 1). Such TFTs also have excellent field-effect I-V characteristics with large field-effect mobilities of 140 cm$^2$ V$^{-1}$ s$^{-1}$, high $I_{on}/I_{off}$ ratio of 105, near 1.0V operation with non-hysteretic characteristics, and small gate voltage swings of only 80 mV per decade.

Figure 9A:
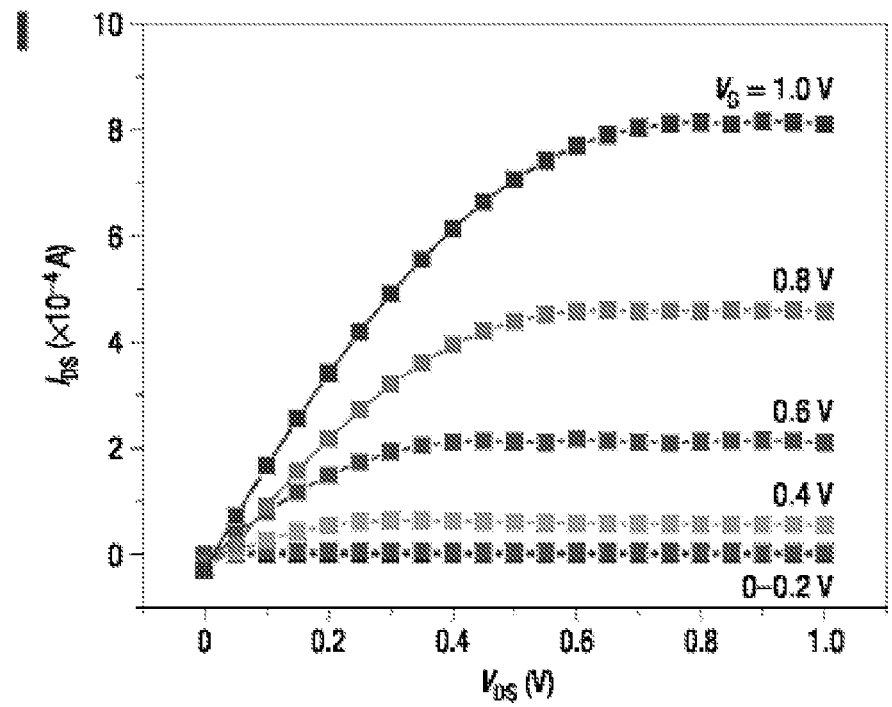
FIGS. 9A-C. Typical field-effect device characteristics of fully transparent inorganic-organic hybrid TFTs on Corning 1737F glass substrates. (A) Current-voltage output characteristics as a function of gate voltage; (B) TFT transfer characteristics of current versus gate voltage (thin-film $In_2O_3$ as the semiconductor (100 μm (L)×5 mm(W)) and a 16.5 nm SAS gate dielectric on glass/ITO substrates with high-conductivity $In_2O_3$ drain/source electrodes); and (C) Transmission optical spectrum of an array of 70 transparent inorganic-organic hybrid TFTs (glass/ITO/SAS/$In_2O_3$/$In_2O_3$ drain and source electrodes) taken through the $In_2O_3$ drain/source region; transmission optical spectra of glass/ITO/SAS and glass/ITO/SAS/$In_2O_3$ structures are also shown for comparison.
Figure 9B:
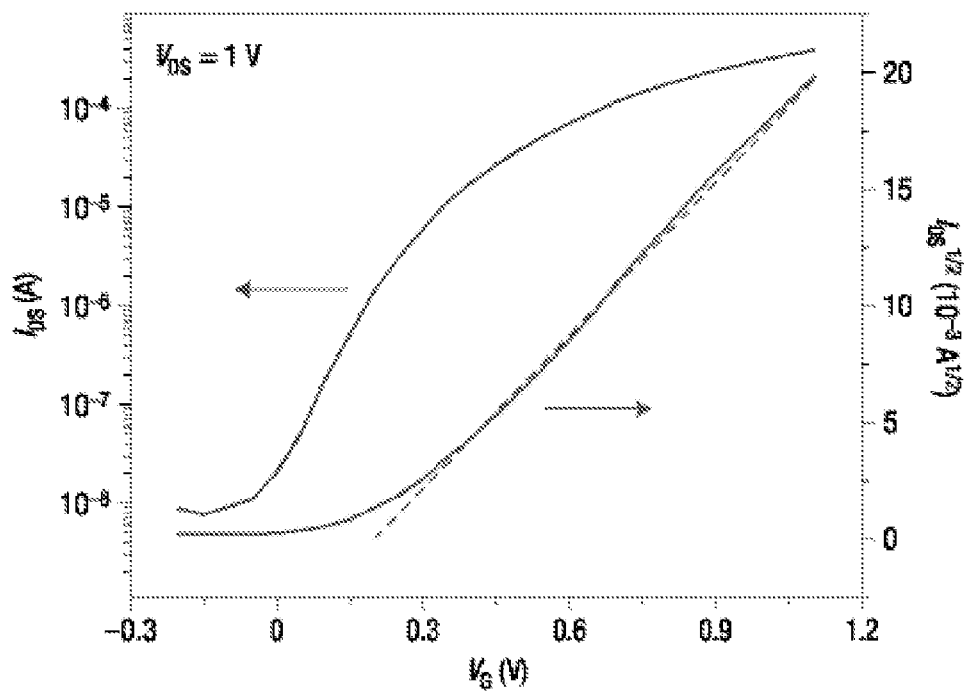
Figure 9C:
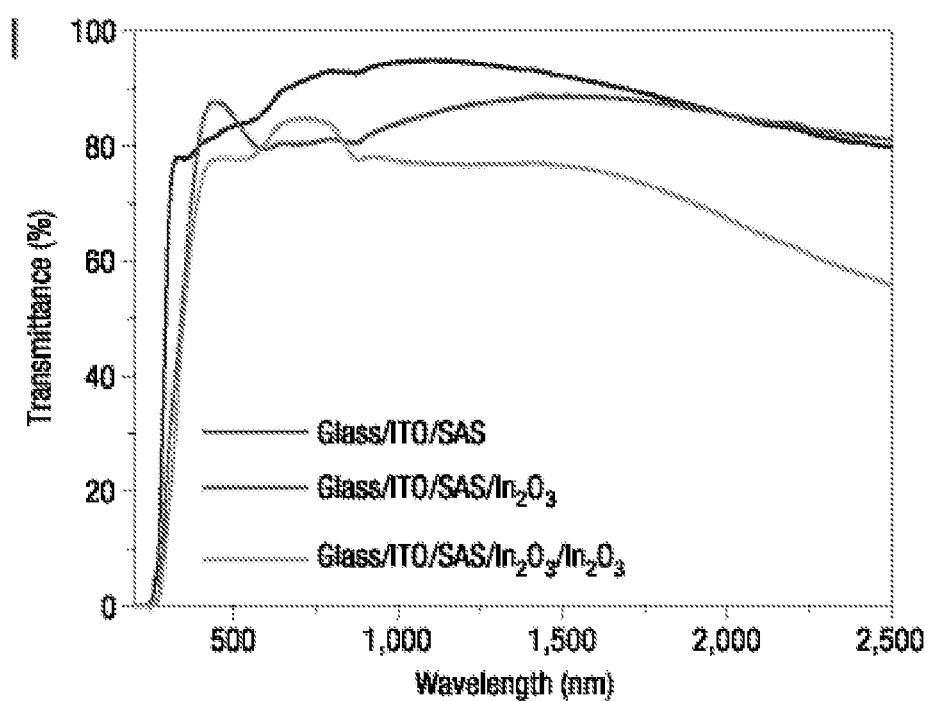

Using high-conductivity IAD-derived In$_2$O$_3$ as drain and source electrodes affords completely transparent TFTs (FIG. 9), having field-effect mobilities of 120 cm$^2$ V$^{-1}$ s$^{-1}$, large on/off ratios of 10$^5$, ~1.0 V operation, essentially hysteresis free characteristics and very small sub-threshold gate voltage swings of 90 mV per decade. Note that such small gate voltage swings (benefiting from both the high-quality In$_2$O$_3$ semiconductor and the high-capacitance organic nanoscopic dielectric) are only slightly larger than the theoretical limit for Si-based TFTs (~60 mV per decade). Estimation of the grain-boundary mobilities $\mu_{GB}$, using a grain-boundary trapping model, provides important information on intrinsic carrier transport characteristics within a single semiconductor grain (Table 1). It can be seen that $\mu_{GB}$ trends are in good agreement with the crystallinity results provided by XRD (FIGS. 2A-B) and that the values of $\mu_{GB}$ are slightly larger than values of $\mu_{FE}$, suggesting that grain-boundary scattering/trapping in these In$_2$O$_3$ films may limit $\mu_{FE}$. That these hybrid TFTs on glass substrates are colorless and highly transparent is shown by transmission optical spectra (FIG. 9C). The transmittance of an entire 70-device TFT array (glass/ITO/SAS/In$_2$O$_3$/In$_2$O$_3$ drain and source electrodes) is >80% in the visible region, and a colourful pattern beneath the aforementioned TFT array can easily be seen.

Following a similar approach, transparent flexible hybrid TFTs fabricated with organic CPB gate dielectrics were spin-coated by solution-phase techniques at near room temperature. By using commercial available starting materials, organic CPB dielectric films with great cohesion and insulating characteristics (robust, smooth, conformal, pin-hole-free, thermally stable) can be deposited on a variety of rigid and flexible substrates. Structures, components, and processes relating to such hybrid TFTs are shown in FIGS. 1E-G. The semiconducting In$_2$O$_3$ channel layers, CPB dielectrics, TFT device structures, and electrical properties, were characterized as described below. Such hybrid TFTs exhibit excellent field-effect characteristics on Si substrates, and this fabrication approach is applicable to plastic substrates—e.g., PET to realize flexible "invisible" TFTs with good performance.

Figure 3C:
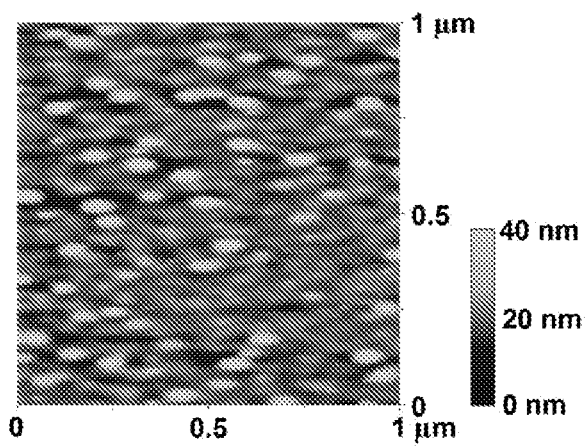

The microstructures and surface morphologies of an In$_2$O$_3$ channel layer in such present hybrid TFTs were characterized by X-ray diffraction (XRD) θ-2θ scans and contact-mode atomic force microscope (AFM), respectively (FIGS. 2C and 3C). Obviously, In$_2$O$_3$ films possesses the characteristic cubic bixebyte structure with (100)-series orientation and considerable crystallinity/texture even when grown on n$^+$-Si/CPB at room temperature, evidenced by the narrow XRD peak width.

Figure 10:
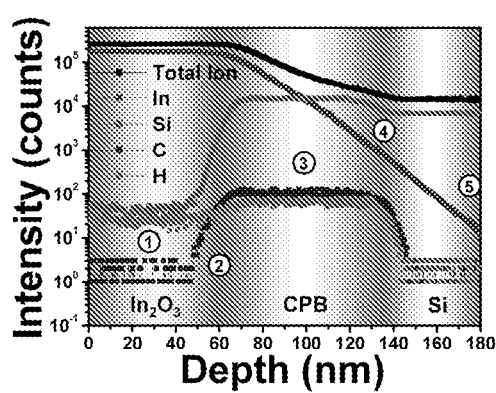
FIG. 10. Secondary ion mass spectrometric (SIMS) depth profile analysis of an $n^+$-Si/SAS/$In_2O_3$ structure.

AFM images show the In$_2$O$_3$ thin films grown on n$^+$-Si/CPB to be compact, dense, and uniform, exhibiting relatively small RMS roughnesses of 3.3±0.2 nm on n$^+$-Si/CPB substrates and 6.9±0.3 nm on PET/ITO/CPB substrates. Note that n$^+$-Si surface morphologies (RMS roughness: ~0.1 nm) are much smoother PET surface (RMS roughness: ~2.2 nm), which to some extent contribute to In$_2$O$_3$ rough surfaces on plastic substrates. The multilayer structural and compositional characteristics of the present hybrid TFTs were investigated on n$^+$-Si/CPB/In$_2$O$_3$ structures by secondary ion mass spectrometric (SIMS) depth-profiling (FIG. 10). The SIMS results show that these mutilayer devices have clear channel/dielectric and dielectric/gate interfaces, and minimal interfacial cross-diffusion. Clear channel/dielectric interfaces no double minimize electron traps and hysteresis effect, and thus lead to large $\mu_{FE}$. The conventional "Scotch tape" adhesion test was carried out to inspect the interfacial adhesion at each interface. No detectable change was found in the thickness, optical microscopic images, and optical transparency before and after the test, revealing that both CPB/In$_2$O$_3$ and gate/CPB interfaces possess strong interfacial adhesion.

The $\mu_{FE}$ in the saturation region is calculated using Equation 1, above; grain-boundary mobilities $\mu_{GB}$ and the interfacial trap densities N$_t$ between the semiconductor and dielectric were computed by plotting $\ln(I_{DS}/V_G)$ at a given drain-source voltage according to Equation 3 (the grain boundary trapping model); the subthreshold voltage swings are obtained at the maximum slope of $dV_G/d(\log I_{DS})$ based on Equation 4.

$$I_{DS} = \frac{W\mu_{GB}V_{DS}C_iV_G}{L}\exp\left(\frac{-q^3N_t^2 t}{8\varepsilon kTC_iV_G}\right) \quad (3)$$

$$S = \frac{dV_G}{d\log I_{DS}} \quad (4)$$

where q is the electron charge, t is the channel thickness, $\varepsilon$ is the In$_2$O$_3$ permittivity, k is the Boltzmann constant, and T is the absolute temperature at room temperature. In$_2$O$_3$ based TFTs were first characterized on n$^+$-Si/CPB substrates, and then on PET/IAD-ITO/CPB substrates (FIGS. 1E-F). TFT device response parameters are summarized in Table 2.

TABLE 2

Component materials and device parameters for TFTs fabricated from In$_2$O$_3$ channel layers and organic CPB dielectrics on Si and PET/IAD-ITO gates using Au or In$_2$O$_3$ drain and source electrodes.

| Gate | In$_2$O$_3$ Thickness (nm) | Dielectric Thickness (nm)/C$_i$ (nF/cm$^2$) | D & S Electrodes | $\mu_{FE}$ (cm$^2$/V·s) | $\mu_{GB}$ (cm$^2$/V·s) | $I_{on}/I_{off}$ | $V_T$ (V) | $N_t$(cm$^{-2}$) | S (V/decade) |
|---|---|---|---|---|---|---|---|---|---|
| n$^+$-Si | 60 | 70/100 | Au | 160 | 171 | 10$^4$ | 0.21 | 9.1 × 10$^{11}$ | 0.24 |
| PET/ITO | 60 | 160/30 | Au | 20 | 26 | 10$^3$ | 0.12 | 2.9 × 10$^{12}$ | 2.78 |
| PET/ITO | 60 | 160/30 | In$_2$O$_3$ | 10 | 22 | 10$^2$ | 0.23 | 3.5 × 10$^{12}$ | 2.98 |

Figure 11A:
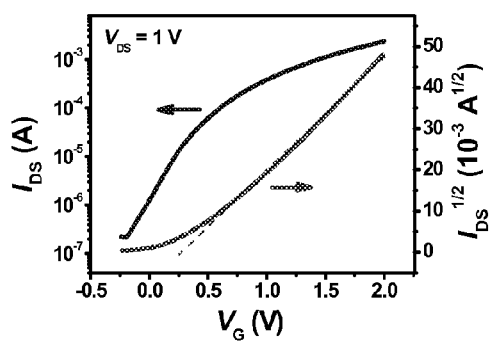
FIGS. 11A-D. Typical field-effect characteristics of inorganic-organic hybrid TFTs using 60 nm thin-film $In_2O_3$ as the channel layer and a 70 nm CPB as the gate insulator on $n^+$-Si substrates with Au drain/source electrodes: (A) transfer current-voltage characteristics; (B) output characteristics as a function of gate voltage; typical field-effect characteristics of flexible inorganic-organic hybrid TFTs using 60 nm thin-film $In_2O_3$ as the channel layer and a 165 nm CPB as the gate insulator on PET/ITO substrates with Au drain/source electrodes; (C) transfer current-voltage characteristics; and (D) output characteristics as a function of gate voltage.
Figure 11B:
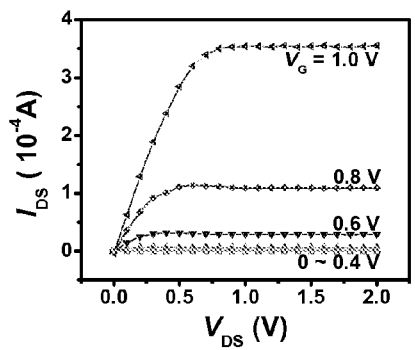

The inorganic-organic hybrid TFTs fabricated on n$^+$-Si/CPB substrates exhibit remarkable I-V characteristics (FIGS. 11A and 11B) at very low operating biases (1-2 V) with classical/crisp pinch-off linear curves in the linear region and steady/flat lines in the saturation region. Owing to In$_2$O$_3$ substantial crystallinity, small interfacial trap densities between channel layers and dielectric layers (Table 2), and advantages of the inorganic-organic hybrid TFT structure, large saturation regime field-effect mobilities of ~160 cm$^2$/V s were obtained in n$^+$-Si/SAS/In$_2$O$_3$/Au devices. This large value represents the highest field-effect mobility in room-temperature TFTs and thus is very promising for high-speed electronics. The threshold voltage $V_T$ of the present devices is only 0.21 V with nearly hysteresis-free response, reflecting that $In_2O_3$ exhibits n-channel materials behavior. Furthermore, $I_{on}/I_{off}$ ratios of ~$10^4$ are achieved, and the maximum drain-source current reaches the mA level, a sufficient value for most portable circuit applications. Small sub-threshold gate voltage swing of 240 mV/decade (Table 2) is achieved at the maximum slope of the current-voltage output curve (FIG. 11A).

Figure 11C:
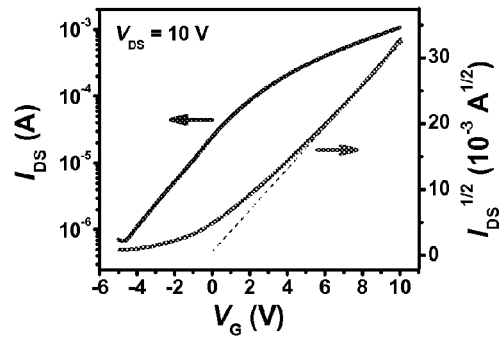
Figure 11D:
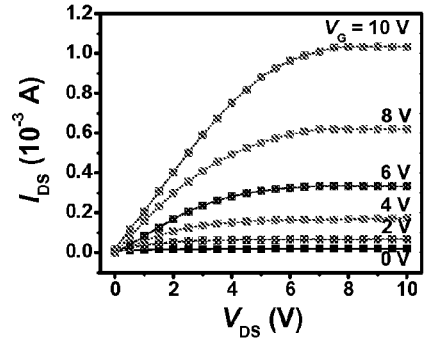

To further explore the versatility and demonstrate the transparency and flexibility of the present inorganic-organic hybrid TFT strategy, $In_2O_3$ TFTs were next fabricated on PET/IAD-ITO/CPB gate structures at room temperature with Au drain/source electrodes (FIGS. 11C and 11D). These TFTs on plastic PET substrates also exhibit excellent field-effect non-hysteretic I-V characteristics with large field-effect mobilities of ~20 $cm^2/V$ s, $I_{on}/I_{off}$ ratio of $10^3$, with moderate operating voltage and gate voltage swings being 10 V and 2.78 V/decade, respectively.

High-conductivity IAD-derived $In_2O_3$ drain and source electrodes afford completely transparent TFTs (FIGS. 12A-C), having substantial field-effect mobilities of ~10 $cm^2/V$ s, on/off ratios >$10^2$, sub-threshold gate voltage swings of 2.98 mV/decade, and essentially hysteresis-free characteristics. Computed with the grain boundary trapping model (Equation 3), the grain boundary mobilities $\mu_{GB}$ and the interfacial trap densities $N_t$ reveal important information on intrinsic carrier transport and trapping characteristics (Table 2), and explain the differences of aforementioned TFT performance on two substrates (silicon and PET). It can be seen that the grain boundary mobilities on PET are much smaller than that on silicon substrates, and qualitatively agree with the field-effect mobility results, reflecting that $In_2O_3$ texture/crystallinity are modest on PET which in turn leads to somewhat lower field-effect mobilities on PET. On the other hand, the value of interfacial trap densities on PET is found to be greater than that on silicon substrates, which also partially explains the smaller mobilities on PET. Intrinsically, the large interfacial trap density is usually caused by rougher morphology, substrate/film mismatch (e.g. density, thermal expansion, hardness), unoptimized processing procedure, and thereby affects TFT properties, especially the field-effect mobility.

The bending effect on flexible TFTs was investigated by bending these flexible TFTs into a curve. No significant changes or residual effects were observed when the bending radius of curvature is as low as 4 cm. That these hybrid TFTs on plastic substrates are colorless and highly transparent is shown by transmission optical spectra and the photo image (FIG. 12C), where the transmittance of an entire 30-device TFT array (PET/ITO/CPB/$In_2O_3$/$In_2O_3$ drain and source electrodes) is ~80% in the visible region.

As demonstrated, representative inorganic-organic hybrid TFTs have been fabricated at room temperature using IAD-derived high-quality semiconducting $In_2O_3$ and organic spin-coatable polymer gate dielectrics. On silicon substrates, the TFTs exhibit field-effect mobilities up to 160 $cm^2/V$ s, $I_{on}$: $I_{off}$=$10^4$, sub-threshold gate voltage swings of 240 mV/decade and function at ~2.0 V. Integrated with PET substrates and transparent drain/source electrodes, optical transparency and mechanical flexibility can be achieved as well as other good field-effect characteristics. Furthermore, the present TFT devices are obtained by large-scale/large-area fabrication techniques (scalable sputtering inorganic semiconductor and simple spin-coatable organic dielectric process) and of all transparent components with good bendability, and thus represent a promising pathway for flexible "invisibles" electronics.

To further demonstrate the generality of the present inorganic-organic hybrid approach, ZnO-based TFTs were fabricated on $p^+$-Si/$SiO_2$ and $n^+$-Si/(polymer dielectric) at near-room temperature. Clear field-effect responses were observed for ZnO-based TFTs with complete light- and air-stability. (See, Table 1, example 3 and FIGS. 13-14.) The results on ZnO-based TFTs further support that such a hybrid approach can be extended to the use of various other semiconducting metal-oxide materials.

Such results demonstrate that hybrid integration of an oxide semiconductor, as illustrated by representative $In_2O_3$ and nanoscopic organic dielectrics provides room-temperature fabricated transparent TFTs with performance unobtainable via conventional approaches. Such a hybrid TFT strategy is applicable to other oxide-based TFT structures (bottom source-drain contacts, top gate, etc.), as well as to other wide-bandgap metal oxide semiconductors and to other transparent ultrathin organic dielectrics. Furthermore, these hybrid devices are compatible with large-scale/large-area deposition techniques and simple dielectric growth processes, and are transparent—a promising approach to high-performance, transparent electronics.

EXAMPLES OF THE INVENTION

The following non-limiting examples and data illustrate various aspects and featuring related to the components/devices and/or methods of the present invention including the fabrication of thin film transistor devices comprising various semiconductor and dielectric components, as are available through the fabrication techniques described herein. In comparison with the prior art, the present components/devices and/or methods provide results and data which are surprising, unexpected and contrary thereto. While the utility of this invention is illustrated through the use of several components and device configurations, it will be understood by those skilled in the art that comparable results are obtainable with various other components, devices or configurations thereof as are commensurate with the scope of this invention.

Example 1

TFT Fabrication. $In_2O_3$ thin films were deposited on $p^+$-Si/$SiO_2$ (Process Specialties, Inc.), $n^+$-Si/(SAS nanodielectric) ($n^+$-Si from Process Specialties, Inc.), $n^+$-Si/(crosslinked polymer blend dielectric), and PET/ITO/(crosslinked polymer blend dielectric) (ITO/PET, ($R_{sheet}$=80Ω/□), from CPFilms Inc.), and IAD-derived glass/ITO (Corning 1737F glass substrates from Precision Glass & Optics; the ITO gate was deposited by IAD at room temperature; sheet resistance=60Ω/□) as the back gate. The nanoscopic organic gate dielectrics (SAS, three 5.5 nm layers of type III; CPB, 20 nm prepared from poly-4-vinylphenol+1,6-bis(trichlorosilyl)hexane) were grown via layer-by-layer self-assembly or spin-coating, as provided in the references incorporated herein. Poly-4-vinylphenol and 1,6-bis(trichlorosilyl)hexane were purchased from Aldrich and Gelest, respectively.

$In_2O_3$ films were grown with a Veeco horizontal dual-gun IAD system at room temperature. The $In_2O_3$ target (99.99%) was purchased from Plasmaterials. During the semiconducting $In_2O_3$ deposition process, the growth system pressure and $O_2$ partial pressure were optimized at $4.0 \times 10^{-4}$–$4.4 \times 10^{-4}$ torr and $2.2 \times 10^{-4}$–$2.6 \times 10^{-4}$ torr, respectively. The growth rate of the $In_2O_3$ thin films was $3.3 \pm 0.2$ nm $min^{-1}$. During the $In_2O_3$ drain- and source-electrode deposition, the growth-system pressure and O$_2$ partial pressure were at 2.7×10$^{-4}$ torr and 0.4×10$^{-4}$ torr, respectively. The conductivity of the In$_2$O$_3$ drain and source electrodes was measured to be 1,400 S cm$^{-1}$ by a four-probe technique. The ITO films were deposited using the same IAD growth system at room temperature. The ITO target (In$_2$O$_3$/SnO$_2$=9:1) was purchased from Sputtering Materials, and the ITO growth-process details have been reported elsewhere.

A top-contact electrode architecture was used in TFT device fabrication. The 50 nm Au source and drain electrodes were deposited by thermal evaporation (pressure ~10$^{-6}$ torr) through shadow masks, affording channel dimensions of 50/100 µm(L)×5 mm(W). Alternatively, 150 nm In$_2$O$_3$ source and drain electrodes were deposited by IAD through the same shadow masks for completely transparent TFTs. The top-contact Si/SiO$_2$/In$_2$O$_3$/Au, Si/SAS/In$_2$O$_3$/Au and glass/ITO/SAS/In$_2$O$_3$/(Au or In$_2$O$_3$) TFT device structures are shown in FIG. 1. Further details concerning organic dielectric growth and device fabrication are provided in the aforementioned incorporated references and are also reported in the literature. See, Yoon, M. H.; Facchetti, A.; Marks, T. J. *Proc. Natl. Acad. Sci. U.S.A.* 2005, 102, 4678; Yoon, M.-H.; Yan, H.; Facchetti, A.; Marks, T. J. *J. Am. Chem. Soc.* 2005, 127, 10388.

Example 2

Characterization. In$_2$O$_3$ film thicknesses were verified using a Tencor P-10 step profilometer by etching a step following film growth. XRD θ-2θ scans of In$_2$O$_3$ were acquired with a Rigaku DMAX-A diffractometer using Ni-filtered Cu Kα radiation. Optical transmittance spectra were acquired with a Cary 500 ultraviolet-visible-near-infrared spectrophotometer and were referenced to the spectrum of uncoated Corning 1737F glass. Film surface morphologies were imaged on a Digital Instruments Nanoscope III AFM. Quantitative SIMS analysis was carried out on a MATS quadrupole SIMS instrument using a 15 keV Ga$^+$ ion source. Conductivities of the semiconducting In$_2$O$_3$ thin films were measured with a Keithley 2182A nanovoltmeter and 6221 current source. The electrical properties of highly conductive ITO and In$_2$O$_3$ films were characterized on a Bio-Rad HL5500 van der Pauw Hall-effect measurement system. TFT device characterization was carried out on a customized probe station in air with a Keithley 6430 subfemtometer and a Keithley 2400 source meter, operated by a locally written Labview program and GPIB communication. The parameters µ$_{GB}$ and N$_t$ (Table 1) were computed by plotting ln(I$_{DS}$/V$_G$) at a given drain-source voltage using the grain-boundary trapping model and equation 3, as above.

$$I_{DS} = \frac{W\mu_{GB}V_D C_i V_G}{L} \exp\left(\frac{-q^3 N_t^2 t}{8\varepsilon k T C_i V_G}\right),$$

where W and L are the channel width and length, respectively, µ$_{GB}$ is the grain-boundary mobility, V$_D$ is the applied bias between the drain and source electrodes, C$_i$ is the dielectric capacitance, V$_G$ is the gate bias, q is the electron charge, N$_t$ is the interfacial trap density between the semiconductor and dielectric, t is the channel thickness, ∈ is the In$_2$O$_3$ permittivity, k is the Boltzmann constant and T is the absolute temperature at room temperature.

Example 3

Figure 13A:
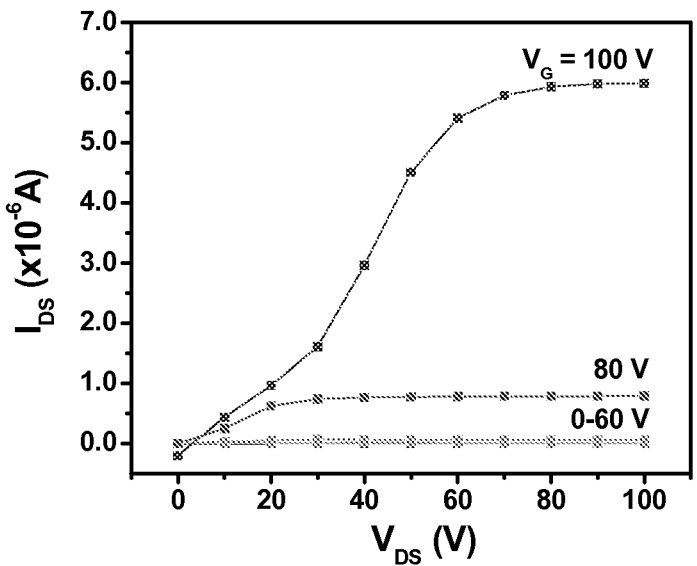
FIGS. 13A-B. Typical field-effect device characteristics of pure inorganic TFTs using a thin-film ZnO semiconductor and $SiO_2$ dielectric on $p^+$-Si substrates: (A) current-voltage output characteristics as a function of gate voltage; and (B) TFT transfer characteristics of current vs. gate voltage.
Figure 13B:
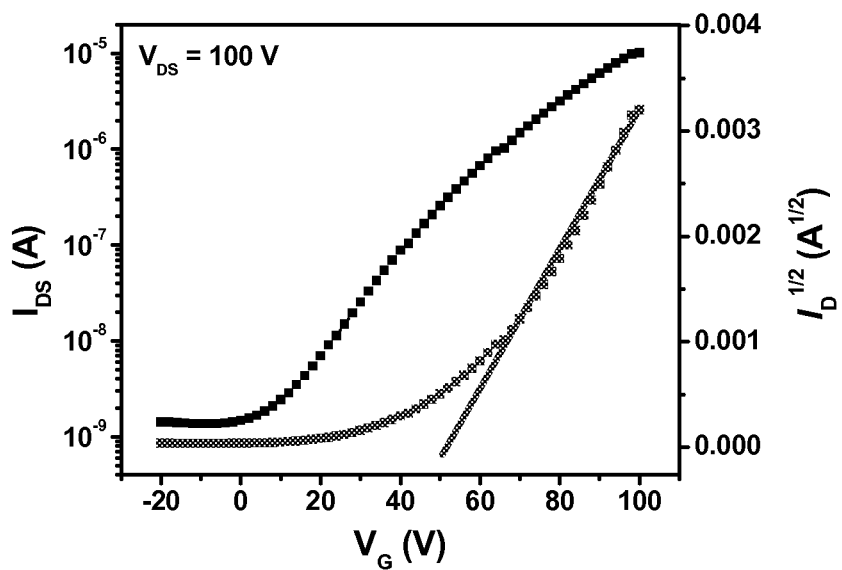
Figure 14A:
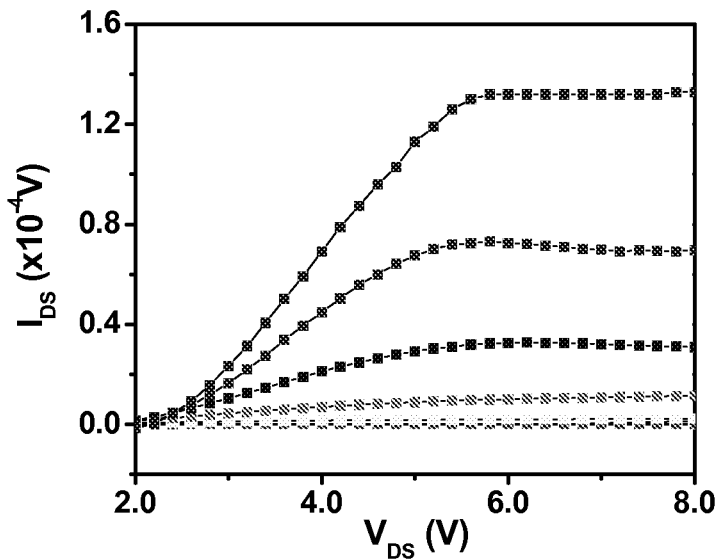
FIGS. 14A-B. Typical field-effect device characteristics of inorganic-organic hybrid TFTs using thin-film ZnO as the semiconductor and cross-linked polymer dielectrics on $n^+$-Si substrates: (A) current-voltage output characteristics as a function of gate voltage; and (B) TFT transfer characteristics of current vs. gate voltage.
Figure 14B:
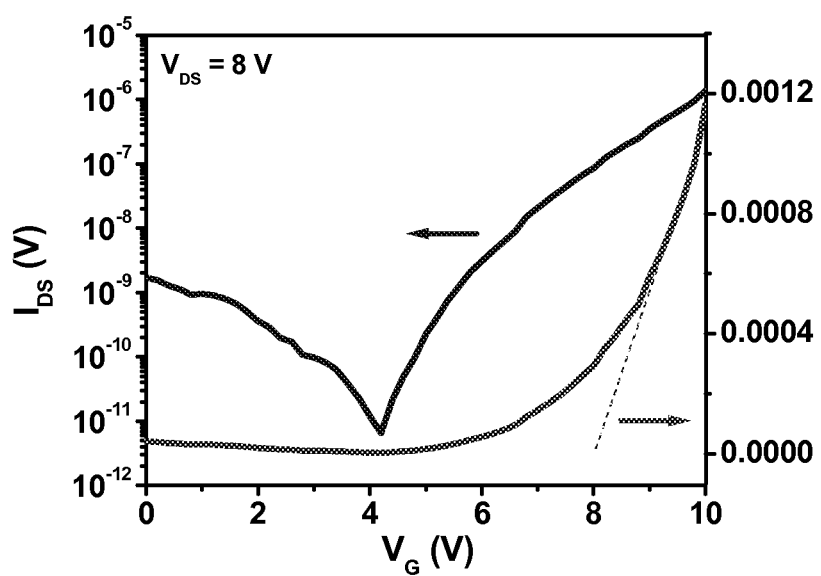

TFTs fabricated with another inorganic n-channel semiconductor, ZnO, are demonstrated on inorganic SiO$_2$ dielectrics. For instance, ZnO films were deposited on p$^+$-Si/SiO$_2$ (300 nm) substrates at room temperature by ion-assisted deposition (IAD). The ZnO thin film growth conditions were similar to those of In$_2$O$_3$, above. The energies (currents) used to produce the primary and assisted ion beams were 180 W(186 mA) and 75 W(37 mA), respectively. The system growth pressure and O$_2$ partial pressure were 2.8×10$^{-4}$~3.0× 10$^{-4}$ Torr and 0.5×10$^{-4}$~0.8×10$^{-4}$ Torr, respectively. The growth rate of ZnO thin films was 4.1±0.1 nm/min. All ZnO TFTs were fabricated at room temperature. The ZnO films exhibited clear field-effect n-type response. Details of such ZnO TFT characteristics are shown in FIGS. 13-14. In particular, ZnO TFTs fabricated on p$^+$-Si/SiO$_2$ substrates exhibit typical field-effect I-V characteristics (FIG. 13A) with classical linear and pinch-off saturation lines. ZnO TFTs show a field-effect mobility of 0.02 cm$^2$/V·s and drain current on/off ratio of ~10$^4$, respectively, with great light- and air-stability when exposed to ambient environment.

While the principles of this invention have been described in connection with specific embodiments, it should be understood clearly that these descriptions are added only by way of example and are not intended to limit, in any way, the scope of this invention. For instance, the present invention can comprise various silicon gallium-arsenide and other Group II-V semiconductor components. Likewise, the present invention contemplates various other device structures, in addition to thin film configurations.

The invention claimed is:

1. A metal oxide thin film transistor device comprising a substrate, a gate conductor, source-drain contacts, and an inorganic-organic hybrid thin film composition comprising an inorganic semiconductor layer coupled to an organic layer, wherein the inorganic semiconductor layer is a channel layer and comprises a metal oxide comprising indium.

2. The device of claim 1, wherein the inorganic semiconductor layer comprises a metal oxide comprising indium and one or more metals independently selected from a Group 12 metal, a Group 13 metal, and a Group 14 metal.

3. The device of claim 1, wherein the organic layer comprises chemical moieties that can promote substrate sorption, condensation, or intermolecular crosslinking.

4. The device of claim 1, wherein the organic layer comprises hydrolyzable moieties.

5. The device of claim 1, wherein the organic layer comprises a polymeric component, a π-polarizable component, or a combination thereof.

6. The device of claim 5, wherein the organic layer comprises a polymeric component comprising a polymer selected from poly(vinylphenol), polystyrene, and copolymers thereof.

7. The device of claim 5, wherein the organic layer comprises a polymer blend, the polymer blend comprising a polymeric component and a component promoting substrate sorption, condensation, or intermolecular crosslinking.

8. The device of claim 5, wherein the organic layer comprises a π-polarizable component that is coupled to at least one of a silyl moiety and a siloxane moiety.

9. The device of claim 8, wherein the π-polarizable component comprises a non-linear optical chromophore.

10. The device of claim 5, wherein the organic layer comprises a multi-layered composition, the multi-layered composition comprising periodically alternating layers of different materials.

11. The device of claim 10, wherein at least some of the periodically alternating layers are coupled to an adjacent layer by a coupling layer comprising a siloxane matrix.

12. The device of claim 1, wherein the substrate comprises a transparent material and is coupled to the inorganic-organic hybrid thin film composition.

13. The device of claim 12, wherein the device is a completely transparent thin film transistor device.

14. The device of claim 1, wherein the substrate comprises a flexible plastic material and is coupled to the inorganic-organic hybrid thin film composition.

15. The device of claim 14, wherein the device is bendable up to a bending radius of curvature of about 4 cm without residual effects.

16. The device of claim 1, wherein the inorganic semiconductor layer is physically adhered to the organic layer.

17. The device of claim 1, wherein the inorganic semiconductor layer is physically adhered to the organic layer by adsorption.

18. The device of claim 1, wherein the organic layer is chemically bonded to the inorganic semiconductor layer.

19. The device of claim 1, wherein the device operates at an operating voltage ($V_G$) between about 1 V and about 20 V.

20. The device of claim 1, wherein the device exhibits a field-effect mobility of greater than about 100 $cm^2V^{-1}s^{-1}$ at an operating voltage ($V_G$) between about 1 V and about 2 V.

* * * * *